United States Patent [19]
Pennebaker et al.

[11] Patent Number: 5,099,440
[45] Date of Patent: Mar. 24, 1992

[54] PROBABILITY ADAPTATION FOR ARITHMETIC CODERS

[75] Inventors: William B. Pennebaker, Carmel; Joan L. Mitchell, Ossining, both of N.Y.

[73] Assignee: International Business Machines Corporation, Armonk, N.Y.

[21] Appl. No.: 461,210

[22] Filed: Jan. 5, 1990

Related U.S. Application Data

[60] Division of Ser. No. 193,170, May 3, 1988, Pat. No. 4,933,883, which is a continuation of Ser. No. 805,163, Dec. 4, 1985, abandoned.

[51] Int. Cl.$^5$ .............................................. G06F 15/20
[52] U.S. Cl. ................................. 364/554; 364/514; 364/955.5; 375/14
[58] Field of Search ............... 364/550, 551.01, 555, 364/554, 571.01, 514, 200, 900; 375/14, 16, 122; 358/262.2, 430, 261.2, 261.4

[56] References Cited

U.S. PATENT DOCUMENTS

| | | | |
|---|---|---|---|
| 4,096,566 | 6/1978 | Borie et al. | 364/200 |
| 4,285,049 | 8/1981 | Bird et al. | 364/900 |
| 4,363,036 | 12/1982 | Subramaniam | 358/261.2 |
| 4,559,563 | 12/1985 | Joiner, Jr. | 358/430 |
| 4,633,490 | 12/1986 | Goertzel et al. | 375/122 |
| 4,730,348 | 3/1988 | MacCrisken | 364/200 |
| 4,829,575 | 5/1989 | Llyod | 381/41 |
| 4,905,297 | 2/1990 | Langdon, Jr. et al. | 358/261.2 X |

*Primary Examiner*—Joseph L. Dixon
*Attorney, Agent, or Firm*—Thomas P. Dowd

[57] ABSTRACT

The present invention relates to computer apparatus and methodology for adapting the value of a probability of the occurrence of a first of two binary symbols which includes (a) maintaining a count of the number k of occurrences of the first symbol; (b) maintaining a total count of the number n of occurrences of all symbols; (c) selecting confidence limits for the probability; and (d) when the probability is outside the confidence limits, effectuating a revision in the value of the probability directed toward restoring confidence in the probability value. The number of allowed probabilities is, optionally, less than the total number of possible probabilities given the probability precision. Moreover, an approximation is employed which limits the number of probabilities to which a current probability can be changed, thereby enabling the probability adaptation to be implemented as a deterministic finite state machine.

19 Claims, 12 Drawing Sheets

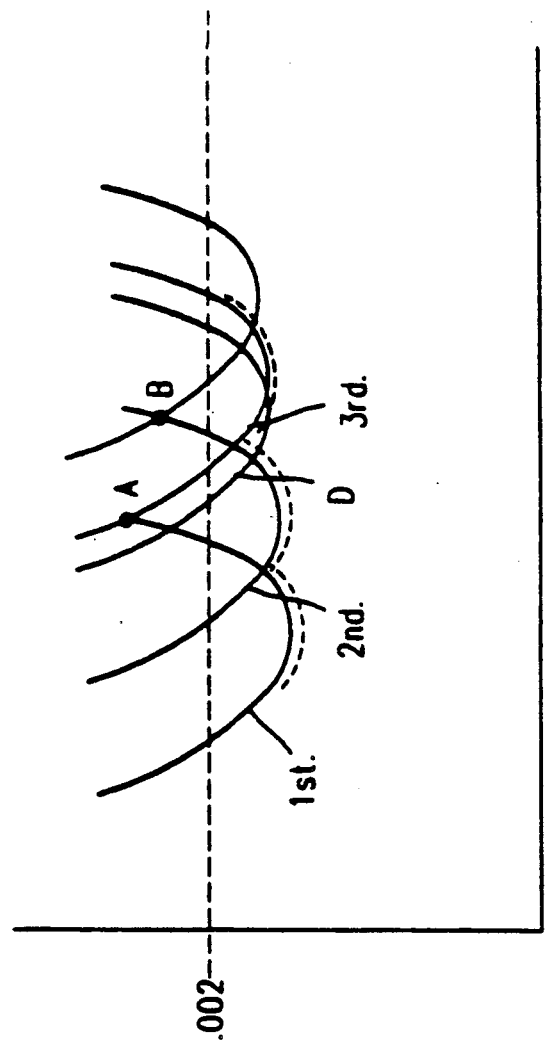

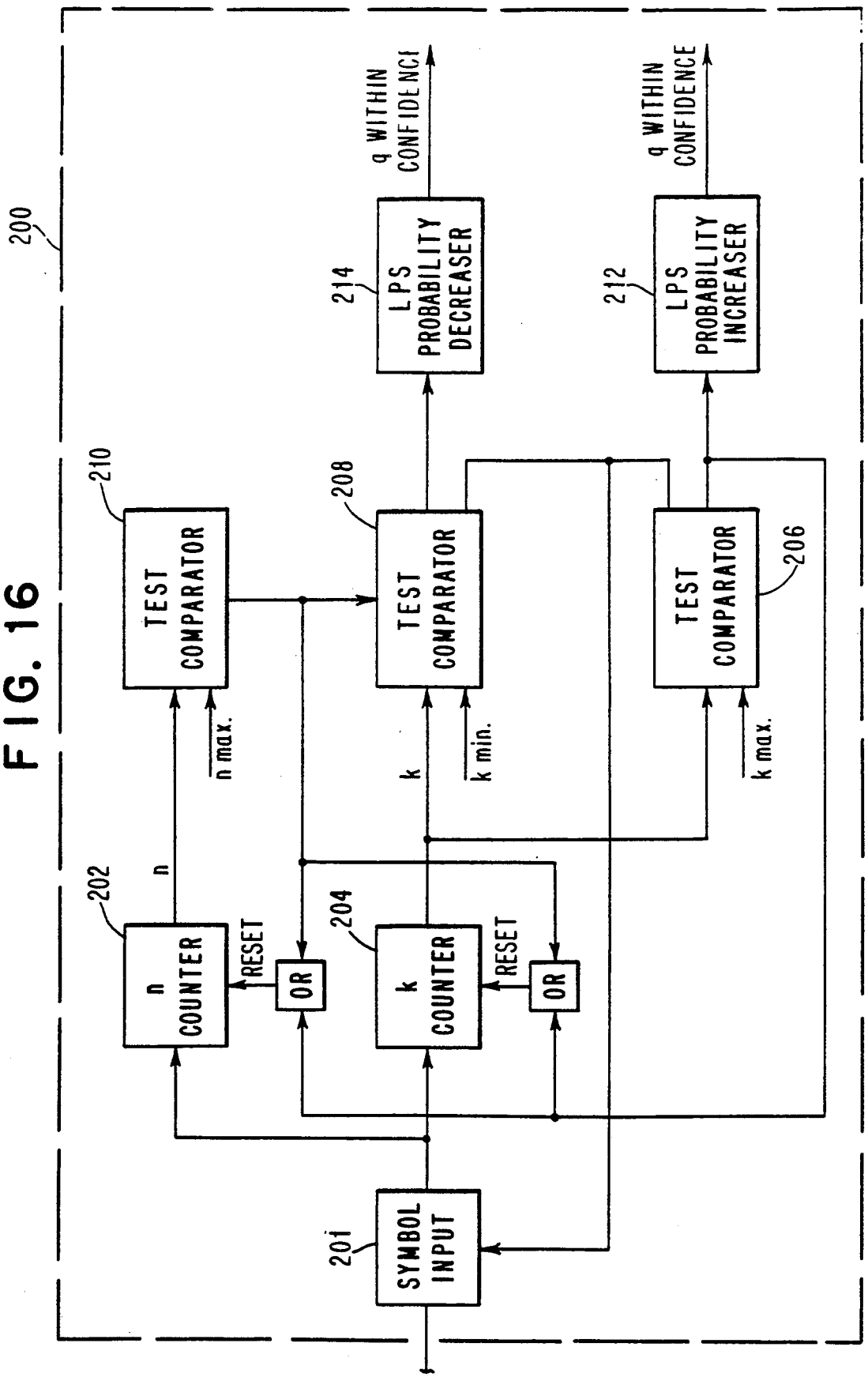

PROBABILITY ADAPTATION FOR ARITHMETIC CODERS

CROSS-REFERENCE TO RELATED APPLICATION

This application is a divisional of application Ser. No. 193,170, filed May 3, 1988, now U.S. Pat. No. 4,933,883, which was a continuation of application Ser. No. 805,163, filed Dec. 4, 1985 and now abandoned.

TABLE OF CONTENTS

Field of the Invention
Background of the Invention
Summary of the Invention
Brief Description of the Drawings
Description of the Invention
1. General Description of Invention
    Table I
    Table II
2. Probability Adaptation in a Log Encoder in an Arithmetic Coding Environment
3. Defining Allowed Probability Values
4. Alternative Embodiments
Appendix I
Appendix II

FIELD OF THE INVENTION

The present invention generally relates to the field of adapting symbol probabilities for binary decisions to reflect probabilities generated from actual decisions. More specifically, the invention involves adapting symbol probabilities in a binary arithmetic coding system.

BACKGROUND OF THE INVENTION

Various phenomena are represented as binary decisions in which one of two decision symbols (such as yes and no) is characterized by one probability (Pr) and the other symbol is charaterized by a probability (1-Pr). The less likely symbol is typically referred to as the less (or least) probable symbol LPS whereas the other symbol is referred to as the more (or most) probable symbol MPS.

Generally, the probability Pr is initially determined as an estimate from previous data or an initial estimate based on intuition, mathematics, assumptions, statistics collection, or the like. This estimate may be correct at some times or under some conditions but may not reflect the true probabilities at other times or under other conditions.

In some prior technology, the probabilities are determined before data processing—such as data encoding—and remain fixed. In such prior art, results obtained may be inaccurate because they are not based on current actual data.

In other prior technology, probabilities are evaluated which are intended to reflect data history. One article which discusses such prior art is included in the IBM Technical Disclosure Bulletin in volume 22, No. 7, December 1979, pps. 2880-2882, and is entitled "Method for Coding Counts to Coding Parameters" (by G. G. Langdon, Jr. and J. J. Rissanen). The article states that it is desired to detect changes in the symbol probabilities from observed symbol occurrences, and modify the LPS probability q accordingly. One approach suggested by the article is to change q to reflect the number of counts of one symbol divided by the total number of symbols counted during a symbol string. That is, if k is the counts for one symbol and n is the number of counts for both symbols, symbol probability is changed based on k/n.

Another article by Langdon and Rissanen, "Compression of Black/White Images with Arithmetic Coding", IEEE Transactions on Communications, volume COM-29, No. 6, June 1981, discusses adapting probabilities in an arithmetic coding environment. In discussing adaptation to nonstationary statistics, the IEEE article proceeds on page 865 as follows: "Suppose that we have received r (consecutive) 0's at a state z and our current estimate of the probability of symbol s(i) being 0 is $p=c0/c$ . . . where c0 is a count defined as $c(0|z,s(0), \ldots, s(t))$ and c is a count defined as $c(z,s(0), \ldots, s(t))$. We receive symbol s(i). If s(i) is 0, we test: $p'(r+1) \geqq 0.2$? If yes, we regard the observation as being consistent with our estimate of p, and we update c0 and c to form a new estimate . . . If, however, $p'(r+1)<0.2$, the observation is likely an indication of changed statistics and we ought to be prepared to change our estimates to a larger value of p. We do this by halving the counts c0 and c before updating them by 1. We do the same confidence test if s(i) if 1 using the probability p(r) . . . In reality, for the sake of easier implementation, we put suitable upper and lower bounds on the count for the less probable symbol for each skew value Q(s) to indicate when to halve or not the counts." In describing the Q(s) value, it is noted that the IEEE article discusses the approximating of the less probable symbol probability to the nearest value of $2^{-Q(s)}$ where Q(s) is an integer referred to as the "skew number."

Other prior technology includes U.S. Pat. Nos. 4,467,317, 4,286,256, and 4,325,085 and an IBM Technical Disclosure Bulletin article in volume 23, No. 11, April 1981, pps 5112-5114, entitled "Arithmetic Compression Code Control Parameters Approximation" (By. D. R. Helman, G. G. Langdon, Jr., and J. J. Rissanen). The cited references are incorporated herein by reference to provide background information information.

SUMMARY OF THE INVENTION

The present invention addresses the problem of providing a computationally simple yet nearly optimum technique for adaptively determining symbol probabilities in a binary decision context. This object is achieved by a method and apparatus for revising the LPS probability (and, hence, the MPS probability) based on confidence limits. Specifically, the present invention includes estimating the LPS probability q and revising the value of q to a value qnew which is just sufficient to bring the LPS probability into known confidence limits after confidence has been lost.

The present invention provides that the number of LPS symbols be counted (as k) and that the number of total symbols (including LPS and MPS symbolos) be counted as n. An initial estimate for the value of q is initially set. Based on the estimated value of q, the value of n, a selected confidence level C, and an upper bound (ub) and a lower bound (lb) for k is evaluated. If the actual k is beyond the evaluated bounds, q is assigned a revised value qnew which is the minimal adjustment that places k back within the bounds.

Limiting the change of q to just enter k within the bounds set therefor is of great significance. If qnew were adjusted to simply track k/n, the response time to correct for temporarily eccentric data would be inordinately long. That is, data processing (e.g., data encoding) could proceed for a long period with grossly inaccurate probabilities. The present invention achieves the object of adjusting the q value enough to respond to actual counts, but not enough to deleteriously affect computation time as the result of statistical fluctuations.

In this regard, the present invention is of particular value when processing data with a relatively small number of input samples, especially when q has a value near 0.5. Under such conditions, the confidence approach of the present invention significantly outperforms a technique wherein q tracks k/n.

Preferably, the present invention provides a table which includes a plurality of allowed q value entries selected from all possible entries and ordered by magnitude. In its preferred form, the table has m n-bit entries where $m < 2^n$. Entries are selected such that each has a minimum coding inefficiency for at least one actual probability relative to all other possible estimated probabilities. Entries selected in this way are substantially uniformly spaced (along a logarithmic scale). The smaller table size achieves the object of enhanced computational speeds and a reduction in storage requirements.

Moreover, the invention provides for probability adjustments that include approximations that limit the number of permitted next entries from a subject entry. By reducing the number of next extries, the changes in probability can be implemented in a deterministic finite state machine. When confidence is lost, the q value is shifted to a prescribed entry in the table at which confidence is restored. In that way, the minimal adjustment to q is effectuated to restore confidence. In a preferred mode, based on the measure of lost confidence, a shift of one or more entries may be effectuated at one time.

In accordance with the invention, the bounds for k —namely kmin and kmax—remain constant after they are first evaluated. Thereafter, the level of confidence may be permitted to vary in a known manner to derive updated values for q based on incoming data. This achieves the object of facilitated computations where the bounds remain fixed over time and k need not be measured against sliding boundaries. Alternatively, the number of counts nmax used in determining whether k is less than kmin may be adjusted after a loss of confidence, enabling the confidence level to remain unchanged.

The present invention thus permits the LPS (and, hence, the MPS) probability to be adapted as new data is entered. In this regard, the invention permits probability adjustment during a coding process, such as arithmetic coding.

Moreover, in a specific embodiment, the present probability adaptation is applied to an arithmetic coding system in which range is represented and computed in the logarithmic domain—as is set forth in a co-pending application filed on even date herewith, entitled "Log Encoder/Decoder System", and invented by J. L. Mitchell, W. B. Pennebaker, and G. Goertzel (all employees of the IBM Corporation).

BRIEF DESCRIPTION OF THE DRAWINGS

FIG. 15 is an illustration showing the selection of allowed probability values from among the possible probability values based on a given inefficiency coding limit.

FIG. 16 is a block diagram illustrating a probability adaptor apparatus according to the invention.

DESCRIPTION OF THE INVENTION

1. General Description of Invention

Figure 1:
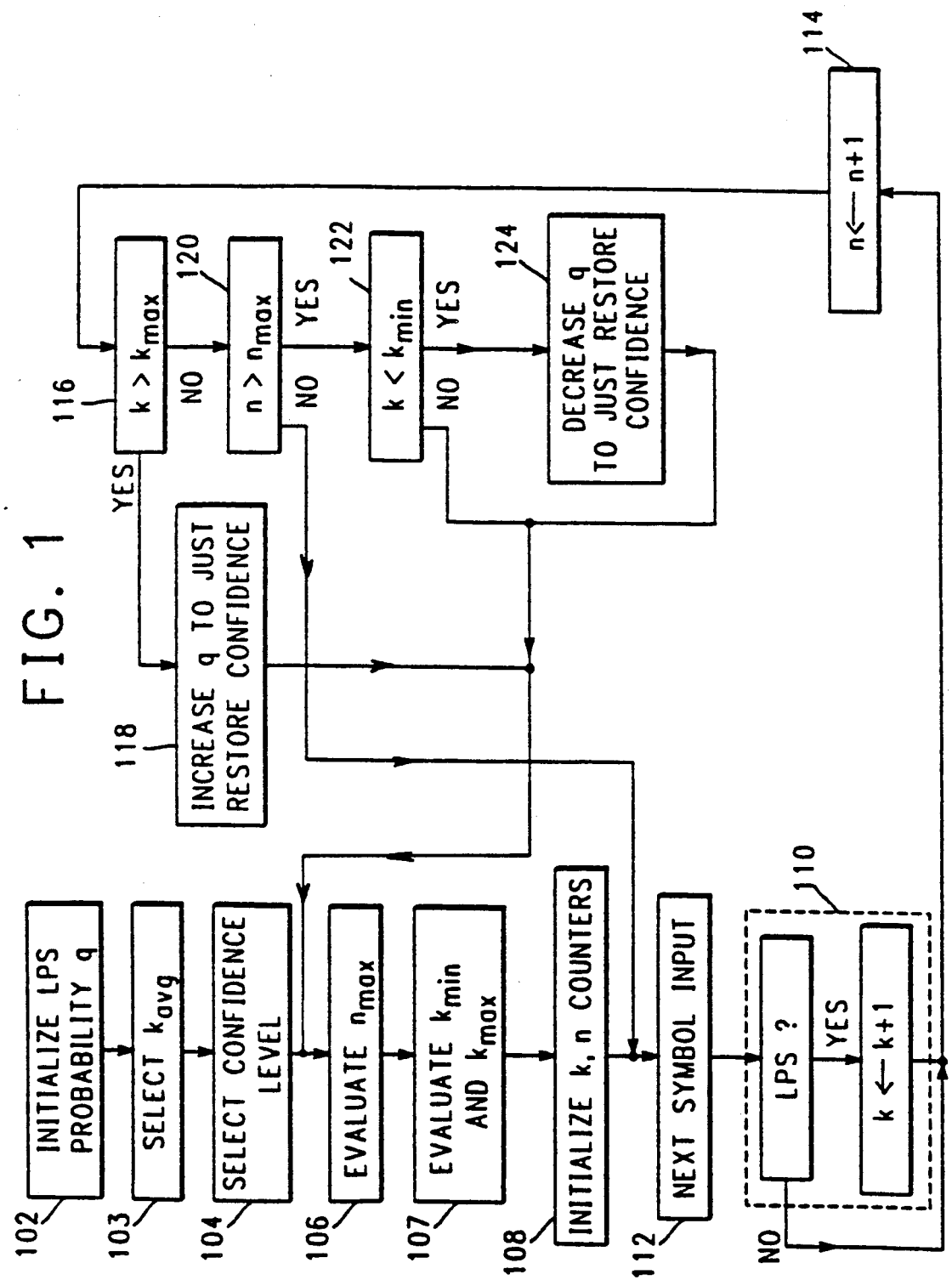
FIG. 1 is a flowchart illustrating the invention in general.

Referring to FIG. 1, a general flowchart shows the steps in adapting a probability q based on the actual symbols of binary decisions. Each decision, it is noted, has two possible outcomes or answers (hereafter referred to as "symbols"). One symbol may represent "0" and the other "1"; or one symbol may represent "black" and the other "white"; or one symbol may represent "yes" and the other "no" depending on context. The more probable symbol at a particular time is referred to as the MPS and the less probable symbol is referred to as the LPS. The LPS symbol probability is identified as q and the MPS symbol probability is identified as p. Accordingly, q is always less than or equal to 0.5.

Such binary decisions are well-known, for example, the occurrence of a white or black symbol for a picture element (pel) in a facsimile system. The probability of a pel being black in a predominantly black background would be expected to be greater than for the pel being white. In this case, the probability of the pel being white is q. Over time or from one background to another, the respective probabilities for the white symbol and black symbol may vary. In this regard, as the background changes from black to white, the probability of a pel being white may switch from being the LPS to the MPS. In accordance with the invention, variations in probability and the switching between LPS and MPS conditions are accounted for.

As seen in FIG. 1, there is an initial estimate for q (and hence for p which is simply $1-q$). If there is no information about the picture background, q and p might be set at 0.5. Generally, however, there is some information suggesting that the probability of q be some lesser value. The initial value for q is entered in step 102.

In step 103, a value for kvag is selected. kavg is selected to represent an expected LPS count and is typically based on historical data or other relevant information. The value selected is somewhat arbitrary, although the value eight (8) has provided notably good results.

In step 104, a confidence level C is selected. Confidence level is a well-known concept in probability theory. Basically, the confidence level is used in answering the question of how much confidence there is that a given statement is true. In the present invention, the use of a confidence level extends beyond the conventional inquiry of how much confidence there is in a statement. The concept of confidence is further employed as a factor in determining how much q should be adjusted when confidence is lost. Confidence is normally measured as a percent or probability and herein may be selected with considerable latitude. In step 104, it may be determined that there should be 60% confidence between q and the actual counts that represent an estimate of q.

Once an initial value for q is set and kavg selected, nmax is evaluated in step 106. nmax corresponds to a maximum number of total symbols that are to be examined as a block of data. This number may be arbitrarily selected but is preferably based on the variable kavg. The kavg nmax is preferably defined as:

$$nmax = kavg/q \qquad (1)$$

Related to the confidence level set forth in step 104 are two limits kmin and kmax which are evaluated in step 107. Corresponding to each limit is a confidence bound level lb and ub, respectively, which indicate the likelihood of a k count falling on or outside the kmin or kmax limit. There are several methods for determining these limits.

One technique for evaluating the lower limit kmin and the upper limit kmax relies on the Bernoulli Theorem which is expressed hereinbelow:

$$P(|(k/n)-q|<e) > 1-C = 1-(pq/ne^2) \qquad (2)$$

where
P is the probability that the estimate k/n is within e of the true probability q
p is the MPS probability
q is the LPS probability
K is the LPS count
n is the total symbol count
k/n is the relative frequency—an estimate of q
e is a bound on the magnitude, $|(k/n)-q|$
Solving for the LPS count, k, Equation (2) yields:

$$kmax < nq + (nqp/C)^{0.5} \qquad (3)$$

$$kmin > nq - (nqp/C)^{0.5} \qquad (4)$$

The limit as set fort in Eqautions (3) and (4) are subject to approximations which attend the Bernoulli Theorem. Hence, although they provide some indication of what the limit may be, a more exact and preferred approace is set forth hereinbelow based on the binomial coefficient expression:

$$P_{k,n} = (n!/k!\,(n-k)!)p^k q^{n-k} \qquad (5)$$

From the binomial coefficient expression, a probability $P_{k,n}$ for each k,n pair is readily computed for q. Conceptually, this may be viewed as a table as in FIG. 2. For each table entry, there is a probability corresponding to k LPS occurring out of n total symbols. To determine kmin, a lower confidence bound level lb is set which represents the total probability of k being less than or equal to kmin. For example, the lower confidence bound is selected so that the probability of k being less than or equal to kmin is approximately 0.18. kmin is that k value at which the sum of probabilities for all entries wherein n=nmax and k≦kmin is less than or equal to 0.18.

Mathematically, this relationship is expressed as:

$$\sum_{k=0}^{kmin} P_{k,nmax} \leq .18 \qquad (6)$$

Figure 2:
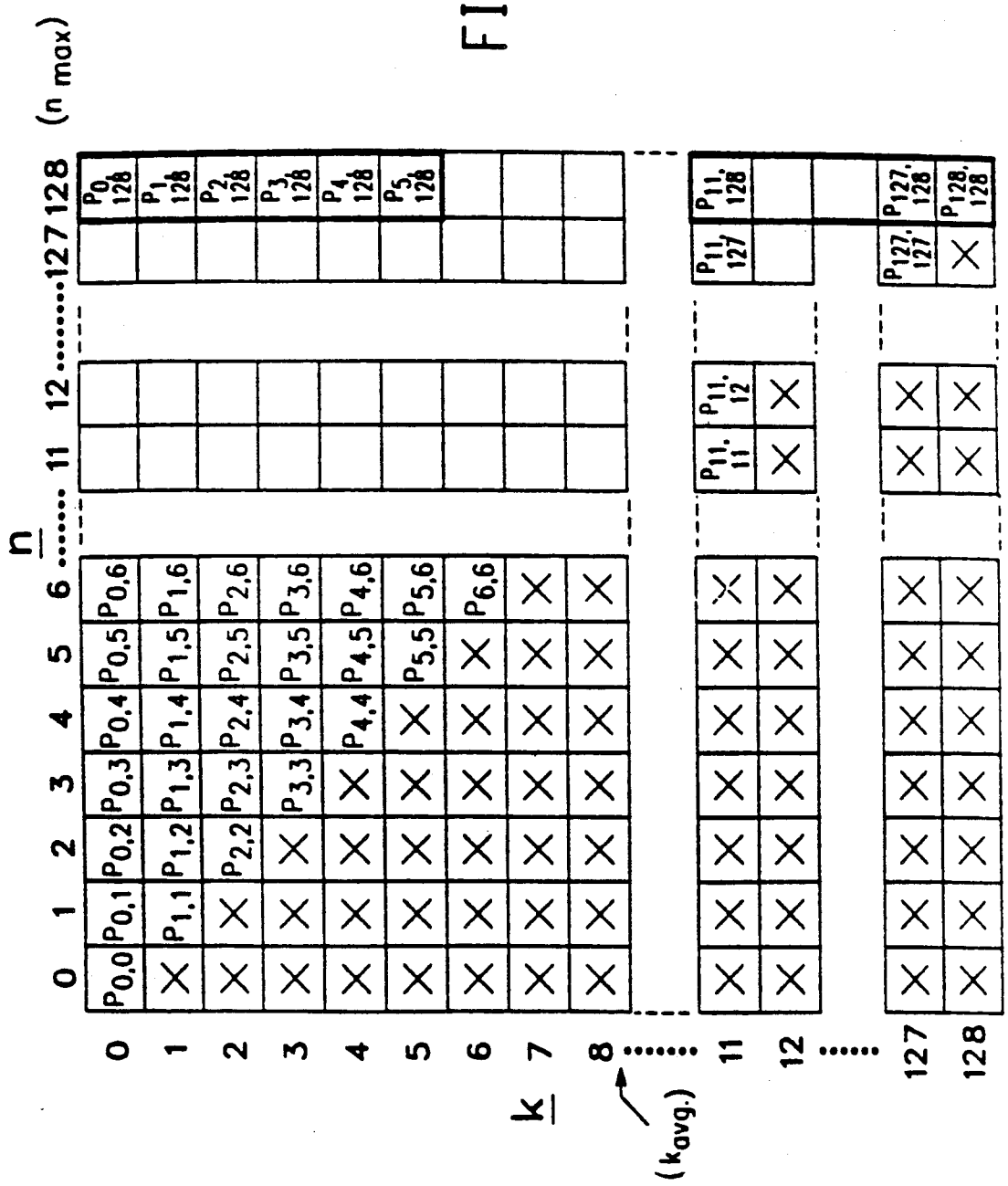
FIG. 2 is an illustration showing probabilities used in probability adaptation according to the present invention.

In the table of FIG. 2, the probabilities that are totalled for kmin=5 are shown with a bold outline in the upper right portion of the table.

In finding kmin, probability sums for each k—starting at k=0—are totalled along the n=nmax until a k is reached at which the confidence level (e.g. 0.18) is exceeded. The highest value for k at which the confidence level is not yet reached is set as kmin. (In practice, the kmin value may be selected to only slightly exceed confidence). In FIG. 2, the kmin value occurs at k=5.

To evaluate kmax, a computation is performed based on an upper confidence bound. Again a confidence bound level of approximately 0.18 is considered, by way of example, for the upper bound. For this computation a kmax is sought wherein the probabilities for all entries along the column n=nmax are summed for all k's where kmax≦k≦nmax. By starting at k=nmax, probability sums of successively decreasing k values may be taken until a sum is detected which is greater than 0.18. The lowest k value at which confidence is not yet reached (i.e., where the sum of probabilities is less than 0.18) is evaluated as kmax at step 108. For kmax=11 and nmax=128, the addend probabilities are shown in the bold outline in the lower right of the table in FIG. 2. Due to the symmetry of the probability distribution, it is observed that kmin is equal or approximately equal to (kavg−Δ) and that kmax is equal or approximately equal to (kavg+Δ). Accordingly, kmax may be readily derived once kmin has been determined.

Figure 3:
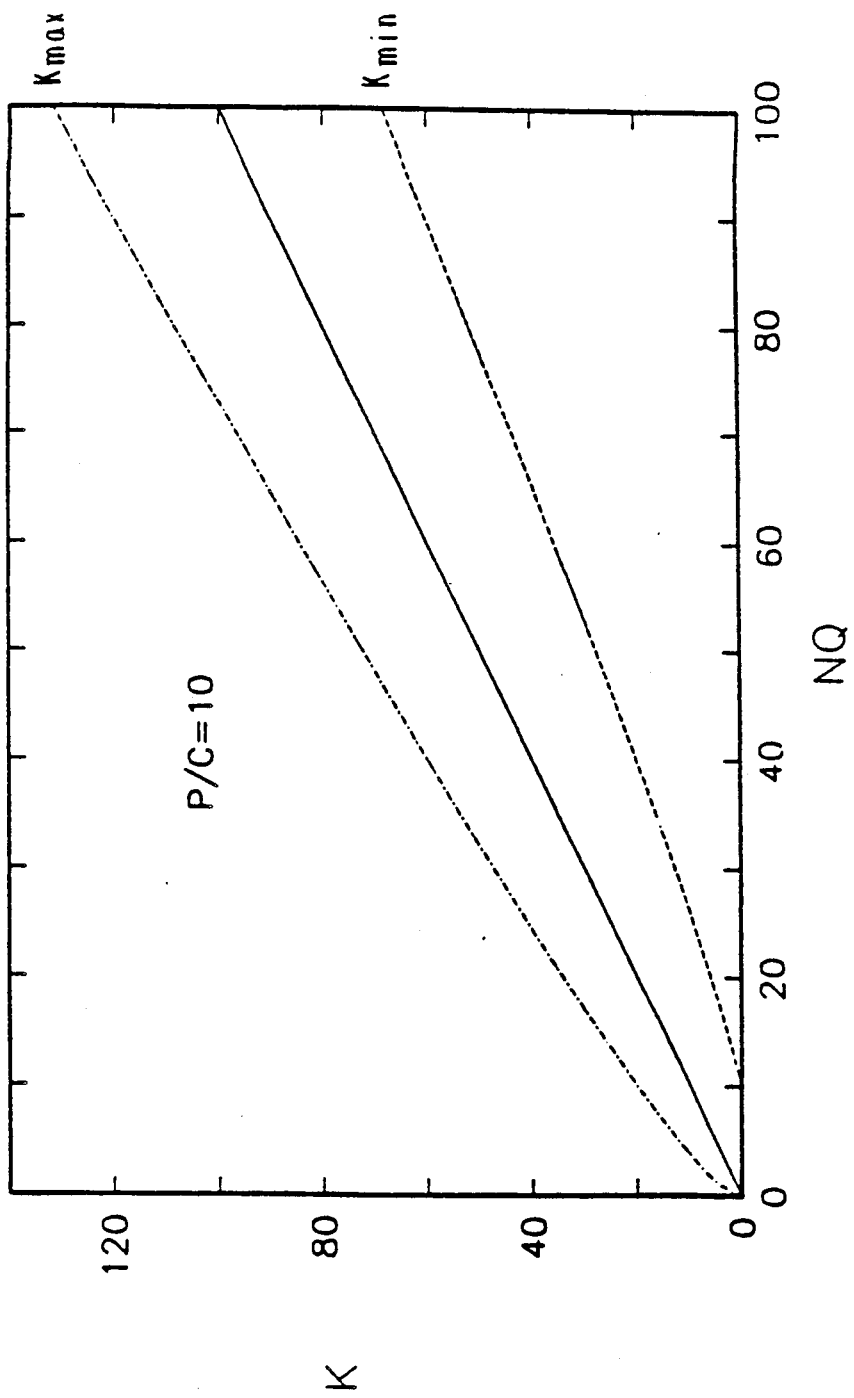
FIG. 3 is a graph showing curves kmin and kmax, on either side of kavg, which indicate the bounds at which confidence is lost under specific conditions.

The values of kmin and kmax are plotted in the graph of FIG. 3 which shows k versus nq. It is noted that the upper bound and lower bound are shown in dashed line representation and correspond to the respective Equations (3) and (4). Referring again to the Bernoulli Theorem, when k and n are small, the true probability that k will exceed a given bound is substantially less than Equation (3) indicates.

In step 108, a k counter and an n counter are initialized to zero. The k and n counts are discussed in greater detail hereinbelow. When initialized to zero, the counters are incremented as appropriate. (As an alternative, the k counter may be set to kmax and the n counter set to nmax. In this alternative approach, each count is respectively decremented until zero is reached. in either case, k and n counts are maintained.)

Given the estimated q, nmax, kmin, and kmax, and initialized counts for k and n, the process of adapting the value of q (and hence p) to better conform to actual symbol data proceeds as follows. At step 112, a next symbol input is entered. With each symbol input, the n count is incremented (if initialized to zero) at step 114. For each symbol input which corresponds to an LPS, the k count is incremented (if initialized at zero) at step 110.

Also, with each symbol input, a comparison is made between k and kmax at step 116. If k is equal to or exceeds kmax, confidence has been lost and q must be adjusted. That is, q is increased in step 118 to a new value (qnew) in order to account for the excessive counts k. With the higher q, the probabilities at the higher end of the table of FIG. 2 increase. In its preferred mode, the present invention provides that —with the new higher q—the values of kmin and kmax remain the same with results in an unchanging value for kavg. Accordingly, based on Equation (1), the value for nmax is reduced.

The adjusting of q to just restore confidence is observed with reference to Tables I and II set forth hereinbelow. Tables I and II are based on Equation (5) which provides for exact calculation of the probability that q is within confidence bounds. In particular, Tables I and II were generated numerically using Equation (5) for values of kavg and a confidence level which simulations have shown give good coding of both fixed and variable statistics files.

TABLE I

| For q = 0.0625, kavg = 8 | | |
| --- | --- | --- |
| confidence level = 0.182426 for kmin = 5, nmax = 128 | | |
| k | qnew | log2(q/qnew) |
| 5. | 0.0625 | 0 |
| 4. | 0.0533 | 0.23 |
| 3. | 0.0439 | 0.51 |
| 2. | 0.0342 | 0.87 |
| 1. | 0.0242 | 1.37 |
| 0. | 0.0133 | 2.24 |
| confidence level = 0.177606 for kmax = 11, nmax = 128 | | |
| n | qnew | log2(qnew/q) | log2(nmax/n) |
| 11. | 0.854 | 4.78 | 3.54 |
| 32. | 0.257 | 2.04 | 2.00 |
| 64. | 0.126 | 1.01 | 1.00 |
| 96. | 0.084 | 0.42 | 0.41 |
| 128. | 0.062 | 0.00 | 0.00 |

TABLE II

| For q = 0.5, kavg = 8 | | |
| --- | --- | --- |
| confidence level = 0.105057 for kmin = 5, nmax = 16 | | |
| k | qnew | log2(q/qnew) |
| 5. | 0.500 | 0.00 |
| 4. | 0.436 | 0.20 |
| 3. | 0.368 | 0.44 |
| 2. | 0.297 | 0.75 |
| 1. | 0.219 | 1.19 |
| 0. | 0.131 | 1.93 |
| confidence level = 0.105057 for kmax = 11, nmax = 16 | | |
| n | qnew | log2(qnew/q) | log2(nmax/n) |
| 11. | 0.815 | 1.43 | 0.54 |
| 12. | 0.716 | 0.81 | 0.41 |
| 16. | 0.500 | 0.00 | 0.00 |

Each of the values of qnew listed in the Tables I and II is the value required to just return to the confidence range, given the value of k and n at which the confidence limit was exceeded.

In the lower portion of Table I, it is observed that if the probability q is to be raised from 0.0625 to 0.854 while maintaining approximately 18% confidence at the upper bound, the maximum n value drops from 128 to 11. It is similarly observed that, if q remains unchanged as a result of data inputs, confidence is maintained with the original nmax value of 128.

In Table II, as in Table I, the upper portion shows the qnew required when k falls below kmin (after nmax total counts) with each respective value 0, 1, 2, 3, 4, or 5. If, after nmax counts, k equals to four, q is adjusted to be 0.436 from its initial value of 0.5. Moreover, in the lower portion which relates to k equalling or exceeding kmax, updated values for the maximum n are noted for new increased q values.

In comparing the two Tables I and II, it is noted that both have the same kmin and kmax values but that, for Table I, q is much smaller than for Table II. The probability of each bound being met or exceeded in Table II is much less than for Table I—about 10% as compared to about 18%.

In examining the tables, it is observed that the upper bound of Table I has the same confidence level as the lower bound of Table I. Similarly, the upper bound and the lower bound of Table II have the same level of confidence. This symmetry is not required. If desired, the confidence at the upper bound may be set at one level and the lower bound may be set at another level.

Similarly, the bounds kmin and kmax could be adjusted as a function of q to provide a more constant confidence level near q=0.5. Allowing the confidence limits to drop to 10% near q=0.5 does not strongly affect the estimate of q, in that statistical fluctuations are still sufficiently proable.

Figure 4:
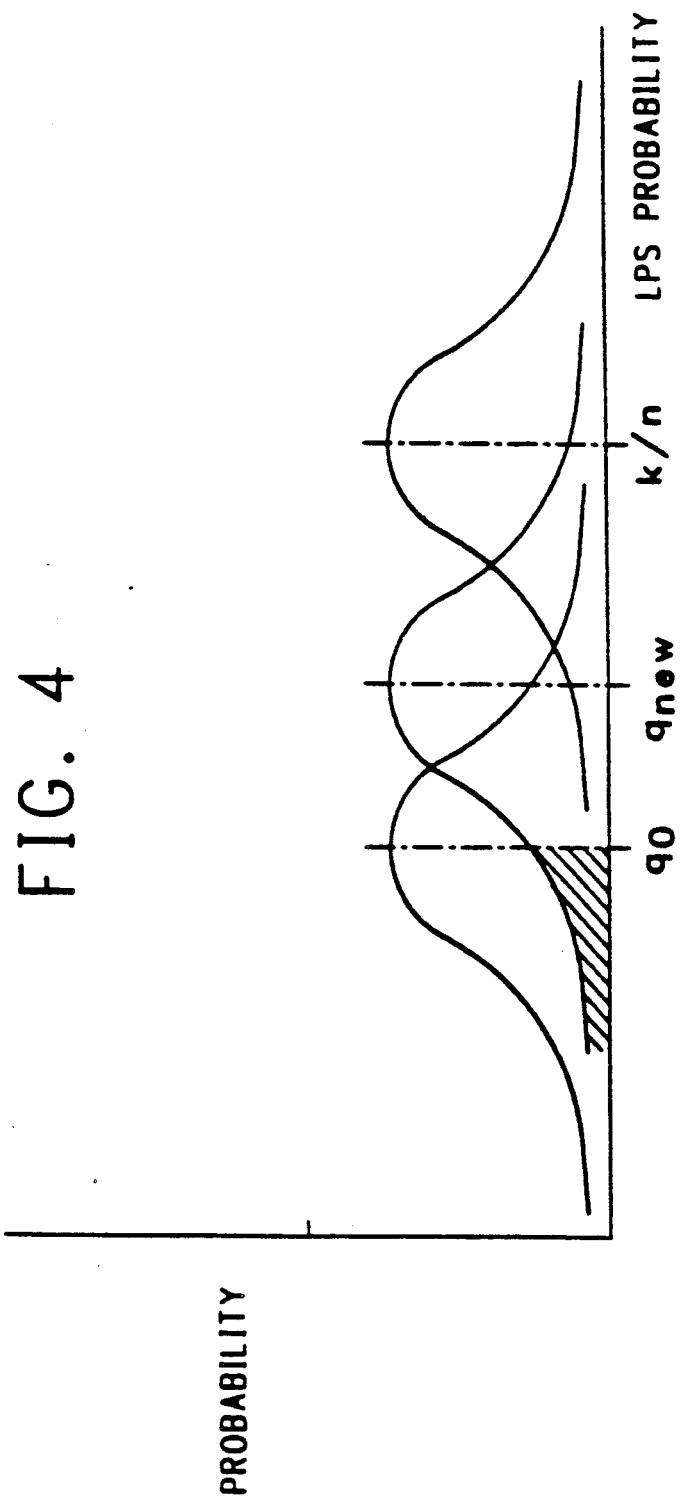
FIG. 4 is an illustration depicting the changing of q to restore confidence.

The significance of just restoring confidence is suggested in FIG. 4. In FIG. 4 the probability distribution for the LPS is shown initially centered on $q_0$. It is then supposed that the actual count ratio k/n for a given block of data is considerably larger than $q_0$. If $q_0$ is increased to k/n, it has been found that inordinate computational requirements may result due to statistical fluctuations. Should $q_0$ in fact be correct, the shifting of the probability curve back to $q_0$ requires an unacccepta bly long computation time when k/n is tracked.

The present invention provides that the probability curve be shifted to a qnew at which confidence is restored, but k/n need not be followed. If an excessive k is again detected, the curve shifts again in the same direction it has already been shifted. If $q_0$ is in fact correct, the earlier statistical fluctuation is readily accounted for with a relatively small shift of the probability curve back towards a center at $q_0$. In this regard, it is observed that—for a 20% confidence bound at the lower end—the area to the left of $q_0$ is 20% of the area under the qnew curve. Similarly, suppose the k count is k" after n" total count and k" exceeds kmax, indicating that confidence has been lost at the upper bound. The present invention, by properly selecting an updated probability value qnew for q, shifts the probability distribution of FIG. 4 so that the area under the probability distribution curve (of FIG. 4) to the right of k"/n" would—for a 20% upper confidence level—be approximately 20% of the total area under the probability distribution curve. The qnew value which achieved this desired shift would become the updated probability value for q.

According to the invention, the new q probability will not be subject to the type of drastic changes which can occur when k/n is tracked. The time during which a grossly inaccurate value for q is used is reduced.

If k does not equal or exceed kmax, a check is made to determined if n equals or exceeds nmax at step 120. If n does not equal or exceed nmax, the next symbol input is entered at step 112. If n does equal or exceed nmax, a determination is made at step 122 as to whether k is less than or equal to kmin. If k is not less than or equal to kmin, there is still confidence at the lower bound and q need not be adjusted.

If $k \leq min$, q is decreased sufficently in step 124 to just restor confidence. The effect of reducing q may be noted in FIG. 2. If q is reduced, the probabilities at the higher k's decrease whereas the probabilities at the lower k values increase. As the probabilities $P_{0,128}$, $P_{1,128}$, $P_{2,128}$, $P_{3,128}$, $P_{4,128}$, and $P_{5,128}$ in the upper right portion of the table increase due to decreasing q, kmin no longer represents a satisfied bound if nmax and the confidence level remain unchanged. To keep the value of kmin constant, nmax is increased. In that way, the k value has more events in which to reach the kmin value.

By maintaining kmin and kmax constant, the k values can be measured against a known fixed value rather than a changing value—thereby facilitating computations.

Whenever q is adjusted, the k and n counts are initialized at step 105. New data is then entered and processed based on the adjusted values of q and nmax.

Tables I and II show the ratio of q/qnew or qnew/q in logarithmic form in base-2 (represented by "log2"). This data is used in the context of a logartithmic encoder/decoder in an arithmetic coding system as detailed hereinbelow. It is noted that generally the ratio qnew/q can be approximated by the value of nmax/n.

Only for qnew greater than 0.5 is the approximation poor. This is because log2(qnew/q) is calculated assuming the MPS and LPS symbols are interchanged at q=0.5. The log2(qnew/q) is really two parts, log2(0.5/q) and log2(qnew/0.5). However, the term qnew//0.5 must be reintepreted because of the symbol interchange, and that reinterpretation is included in the log2 calculation.

As noted previously, the value of q may be obtained from any of various sources, such as defined tables which include only certain possible or optimum values for q. One technique for forming the q table is set forth hereinbelow.

2. Probability Adaptation in a Log Encoder in an Arithmetic Coding Environment The present invention contemplates embodiments which work with data block sizes (nmax) which can be renormalized rather than simply zeroed at the end of each block (as is described in the above embodiment).

In the present embodiment, it is noted that values for various parameters are stored, in table form, as function "inittbl" set forth in Appendix I. In particular, values for (a) the log of the probability p (log p); (b) the log of the ratio of probabilities (log q/p); (c) the maximum total count for a particular log of p value (nmaxlp); (d) how the table pointer must be moved to point to a probability value that is half or nearly half the current value (halfi); and (e) how the table pointer must be moved to point a probability value that is twice or nearly twice the current value (dbli).

In reviewing the table "inittbl", it is observed that each data row comprises ten bytes of data. To move the data pointer from one log p value to the next adjacent value (up or down), the data pointer must be shifted (horizontally) along the length of a data row, e.g. 10 bytes. How far up or down the data pointer is to move depends on how far the new q probability deviates from the previous q value. If k is substantially less than kmin, a halving of q is appropriate and the pointer will be shifted the corresponding number of rows to place the data pointer at the log p value which corresponds to a halving of q. If k reaches kmax at a relatively small value for n, doubling (or even quadrupling) q may be appropriate. If halving or doubling is to be performed, the values set forth in the halfi and dbli columns, respectively, indicate how many bytes the data pointer is to be shifted to effectuate the change. Alternatively, by storing table indices at halfi and dbli for the allowed probabilites, the change from one probability to another probability can be effected without the need for computation. It is observed, in this regard, that an approximation is made in determining qnew to restore confidence. Referring to Table I hereinabove, it is noted that if k=4, when the count n reaches nmax, q should ideally be changed from 0.0625 to 0.0533. Similarly, if k=2 when count n reaches nmax, q should ideally be changed from 0.0625 to 0.0342.

In the presently described embodiment, an approximation for these "ideal" changes is employed. The k value at which the log2 (q/qnew) equals or most closely approximates one is considered to be a threshold. The occurrence of a k value at or below this threshold prompts movement of the data pointer to a new q value that is at least approximately half the current q value. In Table I, q=0.0625 is changed to 0.0342 if k≦2 when n reaches nmax (given the other conditions of Table I). Moreover, if k is between greater than 2 while less than or equal to 5, q is changed to a value one table position away from 0.0625. Accordingly, the change is based on confidence but includes an approximation.

Similarly, if kmax is equalled or exceeded, the value of log2 (nmax/n) is noted. The value of n at which k equals or exceeds $k_{max}$ and at which log2 (nmax/n) is closest to one represents a first threshold $n_1$. The value of n at which log2(nmax/n) is closest to two is a second threshold $n_2$. For all values of n greater than or equal to the first threshold (i.e., $n \geq n_1$), q is increased by moving the data pointer one position in the table. For all values of n, $n_1 > n. \geq n_2$, the value of q is doubled. In Table I, $n_1 = 64$ and $n_2 = 32$. For all values of $n > n_2$, a quadrupling of q is performed.

An examination of Table I shows that log2 (nmax/n) closely approximates log2 (qnew/q) required to restore confidence, thereby justifying the use of log2 (nmax/n) in determining how much change in q should be made. These approximations achieve the results of directing q toward a new value based on confidence while the number of permitted changes in q is limited. As confidence in the current q becomes worse, q is changed by larger factors in step-wise fashion. By limiting the number of next q's which can be selected, the q changing can be practically implemented as a deterministic finite state machine.

It is noted that the probability adjustments are also approximate in that they depend on the coarseness of the table of allowed values.

The allowed values of the entries listed in the inittbl are determined according to a Log Coder which is described in the aforementioned co-pending patent application. The allowed values, it is noted, are those values which remain after a number of constraints are applied. One technique for defining the allowed values is set forth in the next section.

Flow charts relating to the probability adaptation aspect of the Log Coder are now discussed. Note that the oval headers state the function which follows in the flow chart.

By way of terminology, the probability p is also referred to as P and the probability q as Q hereinbelow. The parameter R relates to range in an arithmetic coding system. In this regard, it is recognized that arithmetic coding normally involves assigning a certain symbol string to a specific range along a number line having a prescribed start point along the line. In the Log Coder, the range R is defined in the logarithmic domain. log R is thus the logarithm of the current range R and LR represents the magnitude of the log of R scaled to finite precision by a constant. LP and LQ similarly represent the magnitude of the log of P and Q scaled to finite precision by the same constant.

Figure 5:
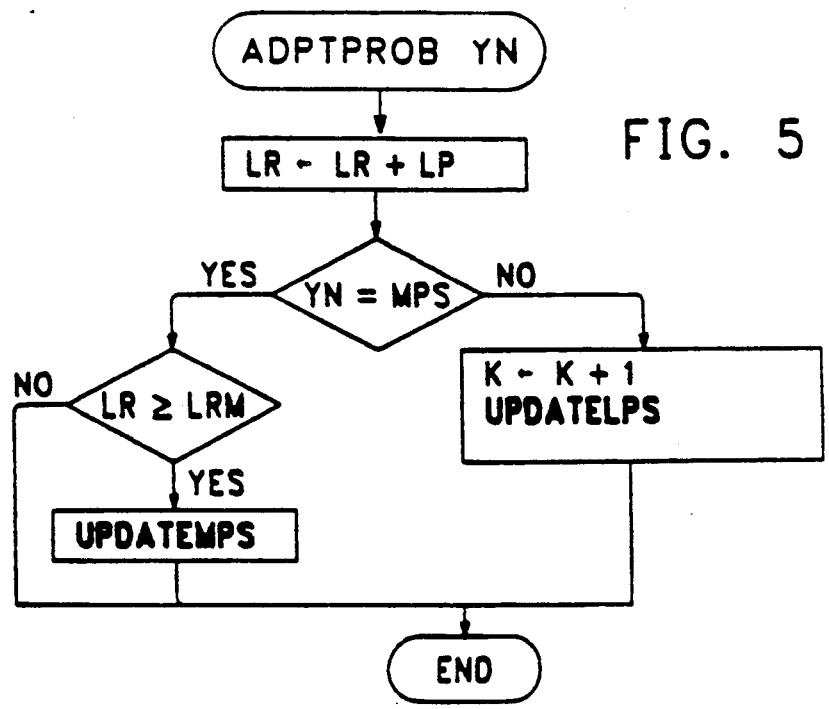
FIG. 5 is a flowchart for a specific binary arithmetic coder embodiment of the invention.

Referring to FIG. 5, a probability estimator flow chart is shown. A scaled logarithmic representation of the range R is updated as LR←LR+LP. This first step corresponds to the range being updated in the logarithmic domain based on the value of the most probable symbol probability. In the general description of the invention, this step corresponds to n←n+1. A decision is then made as to whether the current symbol is an MPS.

If it is, a decision is made as to whether LR is greater than or equal to a predefined maximum value thereof, LRM. If not, no further steps are taken. If so, the MPS is updated according to the flowchart in FIG. 6. Note that LR refers to the same value as n which, in the software set forth in Appendix 1, is counted in units of LP. LRM contains NMAXLP(I) —nmax scaled by LP.

Figure 6:
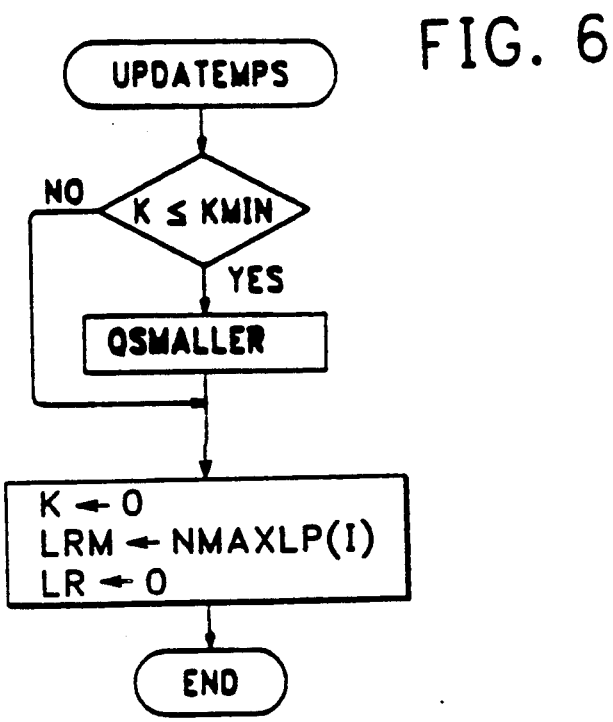
FIG. 6 through FIG. 12 are flowcharts detailing the operations set forth in FIG. 5.
Figure 8:
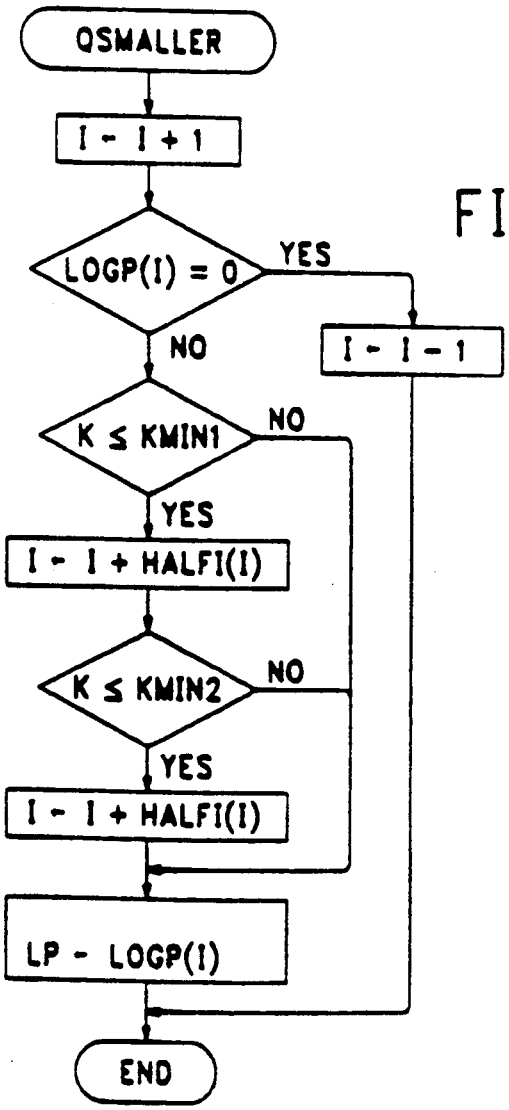

In FIG. 6, UPDATEMPS first provides a test of k≦kmin. If not, k is initialized to zero, LR is initialized to zero, and LRM is set to a value NMAXLP(I). If k is less than or equal to kmin, the probability of q is first decreased according to the subroutine QSMALLER of FIG. 8. That is, if the LPS count k is too small, the probability table pointer I is adjusted to a new position (smaller Q) which restores confidence in the probability estimate. Note that the last entry in the table of log P values is a zero. This is an illegal value which is used as a stop. If zero is encountered the index is backed up to the last valid entry in the table. The value of LP is also updated.

The comparison of LR with LRM, it is noted, is analogous to the comparison of n with nmax in the general description of the invention.

Figure 7:
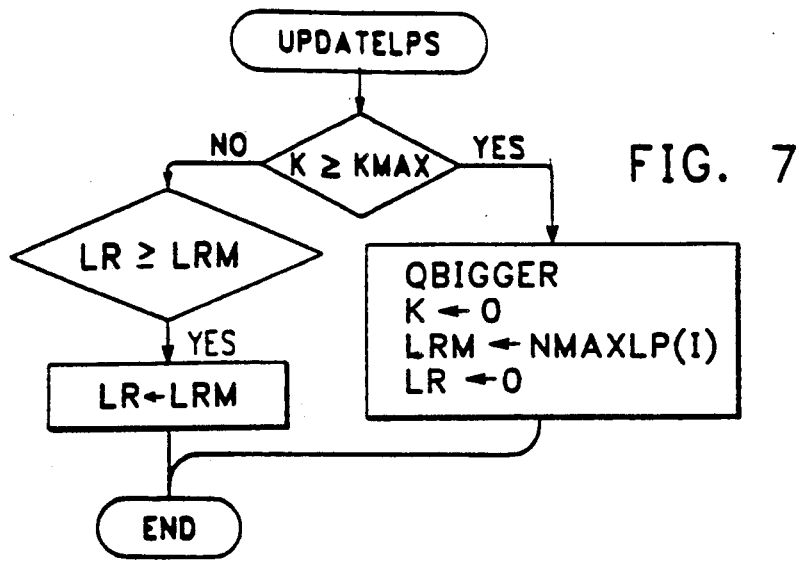
Figure 9:
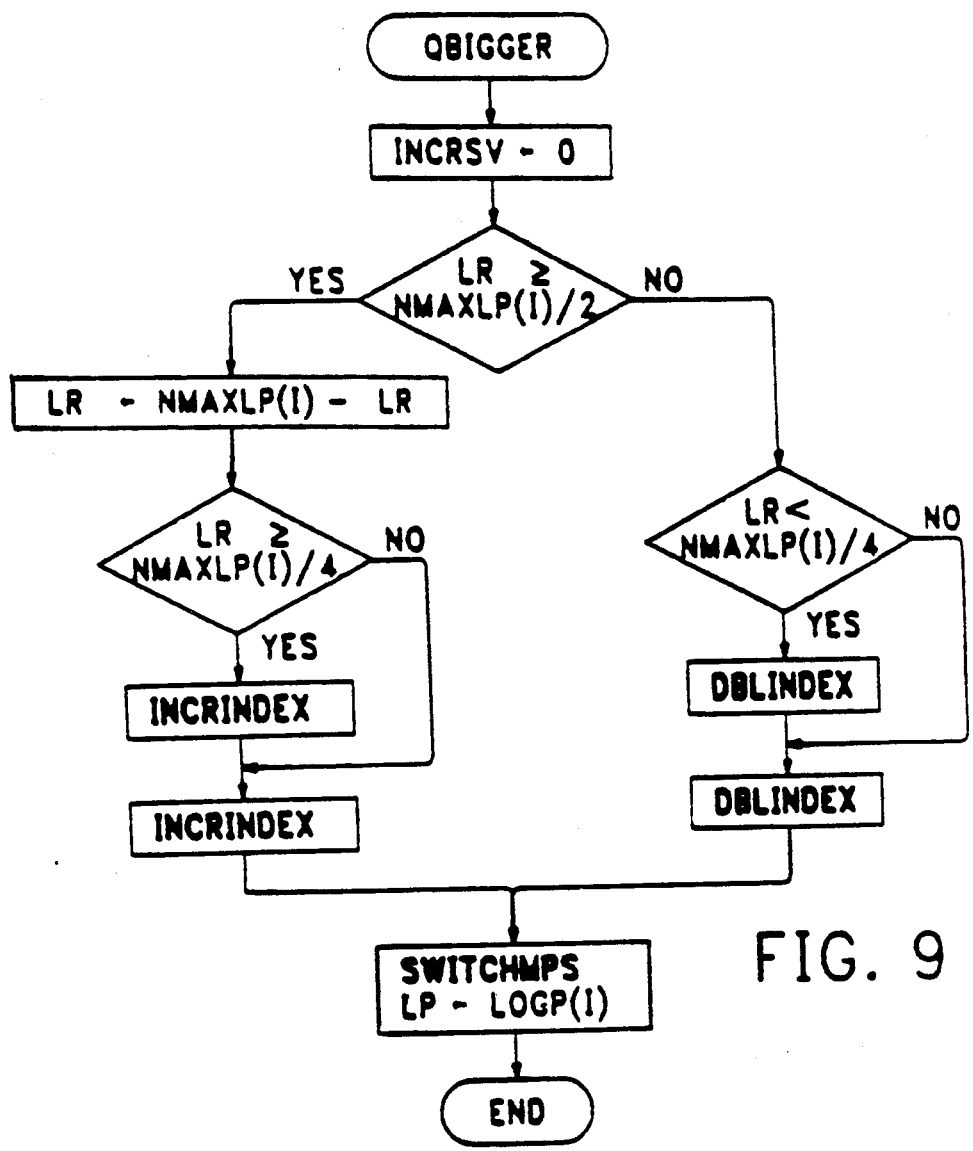

If the symbol is not an MPS, it must be an LPS. The LPS count k is then incremented and the LPS updated according to the UPDATELPS flowchart of FIG. 7. UPDATELPS checks to see if probability adaptation is required by determining if kmax has been reached. If so, QBIGGER of FIG. 9 is called to shift the probability table pointer to a larger Q. Then the LPS count k is zeroed and the block size IRM reset. The event counter LR is reset to zero.

If the current LPS count is within the confidence limits, the total count measure LR is checked to see if it is greater than LRM. If so, it is clamped to LRM.

Figure 10:
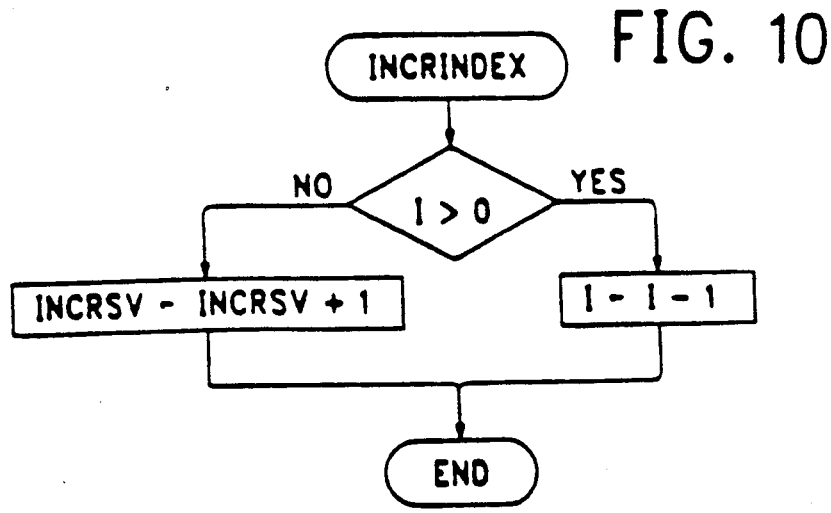
Figure 11:
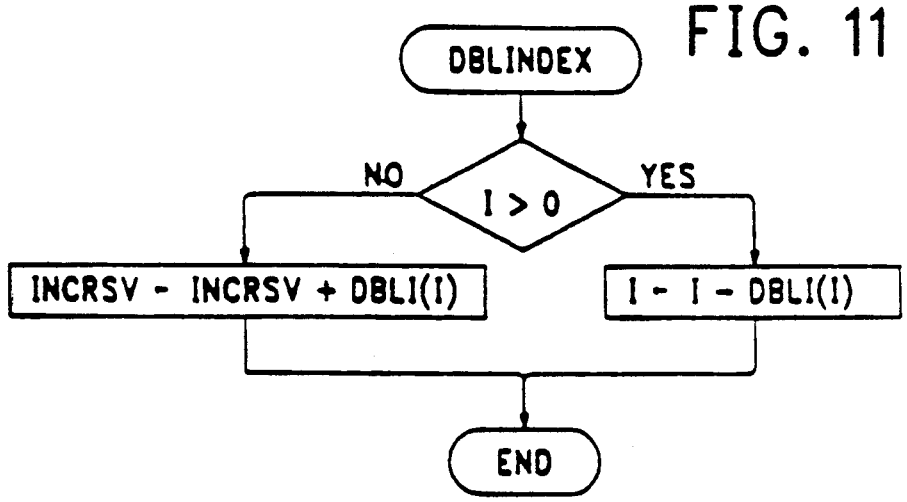
Figure 12:
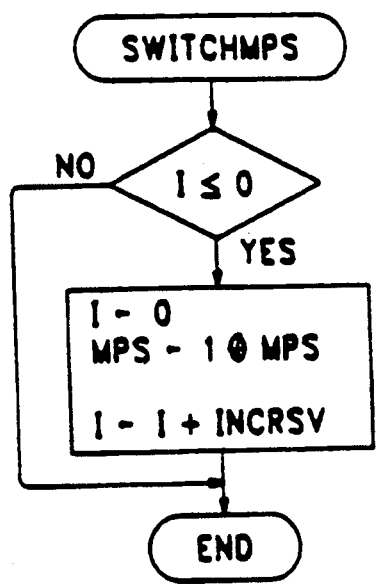

Referring to FIG. 9, QBIGGER moves the probability table index to a larger Q. This action is performed by the routines INCRINDEX of FIG. 10 and DBLINDEX of FIG. 11. Based on the relative values of LR and NMAXPL(I), the index is moved by varying increments as is the corresponding value of Q. INCRINDEX shifts the probability table index to larger Q if possible. DBLINDEX attempts to adjust the probability table index so as to double the value of Q. In both routines, if the Q adjustment cannot be completely done, the remaining index change is saved in INCRSV for use in SWITCHMPS (in FIG. 12).

Figure 13:
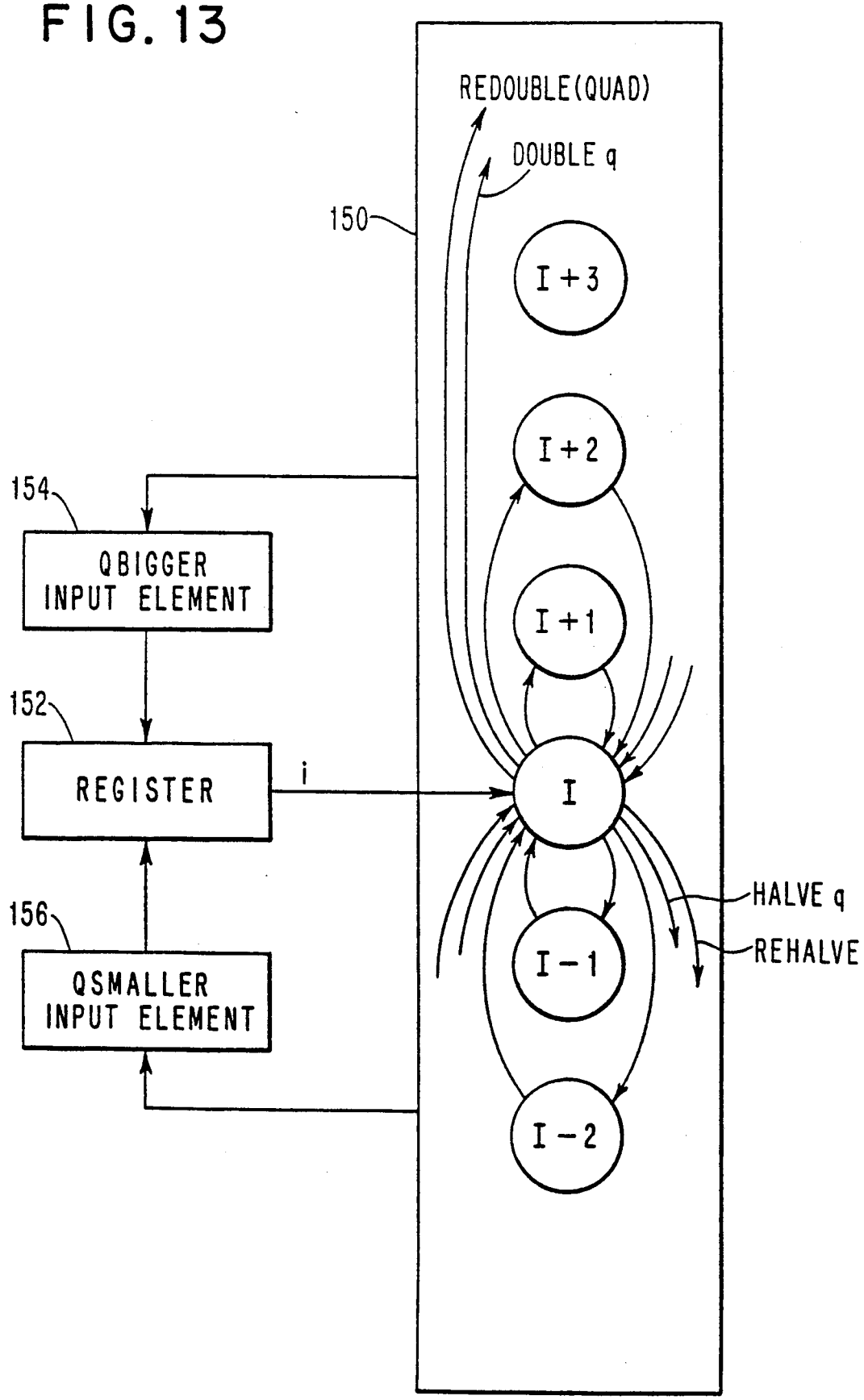
FIG. 13 is a state diagram of a deterministic finite state machine illustrating the probability adjustment process of the invention where various magnitudes of adjustment are provided.

The adjustment of probabilities may be implemented as a deterministic finite state machine such as that shown in FIG.13. In FIG. 13 the states of the machine are shown as (I−2), (I−1), I, (I+1), (I+2), and (I+3). For purposes of example, I is the current state (or table position) corresponding to a current probability. For purposes of discussion, suppose that the probability corresponding to the entry two positions away from state I is half or nearly half of probability of the entry at position I. Suppose that the probability for the entry at position (I+2) represents a doubling of the probability for the entry at position I. For a modest adjustment to the probability, a movement of the data pointer to an adjacent position is effectuated to either position (I−1) or (I+1) as appropriate. Thus, from state (or position) I, the machine permits the next state (or position) to be (I−2), (I−1), (I+1), or (I+2) as appropriate. This is depicted in FIG. 13 by the transition arrows. By way of example, suppose that the probability at state I is 0.5 and that the probability at state (I−1) is 0.35 and at state (I−2) is 0.25. If k is much less than kmin, q is halved by moving the data pointer to state (I−2).

In examining FIG. 13, it should be recognized that doubling and/or halving need not be confined to movement of the data pointer by two positions. For example, doubling in FIG. 13 could require movement of the pointer from the current state I to position (I+3) instead of position (I+2). The transition arrow from I to (I+2) would thus be replaced by an arrow from I to (I+3). Similarly, halving could be effected by movement of the pointer any number of positions depending on the values of probabilities in the table. In any case, when the pointer moves to a new position, that new position becomes the current state from which a specified one of predefined transitions therefrom is taken depending on the existing conditions.

It is noted that each state . . . , (I−2), . . . , (I+3), . . . corresponds to a "slot" in a probability table (PROBTBL) stored in a memory table 150. As in APPENDIX I, movement from one slot (corresponding to a respective state) in the memory table 150 to another is implemented using a register 152—"register i bl p". It is readily observed that b1 is the name given to a real register which contains the value for the index value i. "p", as readily recognizable by an ordinarily skilled artisan, is an abbreviation for a "pointer variable". In other wordsd, the contents of register b1 points to a particular location in the q probability table (PROBTBL). When the value of the LPS probability q is to be made smaller, the index value i—contained in the register—is adjusted to effectuate a move up to a higher slot (or state) in the table.

The index may be incremented to move up one or two slots or may be incremented to effectuate a doubling or redoubling of the probability value—resulting in varying rates of change for the value of q depending on the degree of loss of confidence. That is, the number of slots moved is based on the measure of lost confidence reflected by the k count. The measure of lost confidence is computed in a QBIGGER element 154, the QBIGGER element determining how the register value i and the probability corresponding thereto is to be adjusted.

The value of q is increased by moving the index down a prescribed number of slots (or states) in the memory table 150 based on the relative values of nmax and the count n. The relative values are processed (as discussed in APPENDIX I) by a QSMALLER INPUT element 156 to determine how the value i is to be adjusted.

The arrows in table 150 indicate transitions from a state I to another state. To facilitate viewing, the transitions for only state I are shown—it being recognized that each state has similar transitions extending thereto and therefrom. Table 150 with prescribed next-state transitions corresponds to a deterministic finite state machine. That is, the same final slot (or state) results whenever a given sequence of LPS events and MPS events occur following a given starting slot (or state). The states in FIG. 13 correspond to slots in memory 150 which are indexed based on the value of i in register 152.

If required, QBIGGER also interchanges the definitions of LPS and MPS. Since the probability table does not extend beyond Q=0.5, the symbols are interchanged instead. There is thus a discontinuity in the probability adjustment procedure at Q=0.5. This discontinuity is approximately compensated for by saving the unused table index increment in INCRSV and using it (in SWITCHMPS) to adjust the index to a smaller Q after the MPS-LPS interchange. SWITCHMPS checks to see if the probability table index is at the top of the table. If so, it is time to interchange the MPS and LPS symbols. The revised definition of the MPS is stored in the state information, and any unused table adjustment is now added to I to shift the new interchanged Q to a smaller value.

The test sequence and table pointer adjustment algorithm are described in the aforementioned patent application.

Based on tests, it appears that probability adaptation by just restoring confidence rather than tracking k/n is at least nearly optimum. Moreover, simplicity and computational savings have resulted from employing the technique of just restoring confidence. Appendix II sets forth results of tests performed with the embodiment set forth hereinabove.

3. Defining Allowed Probability Values

Figure 14:
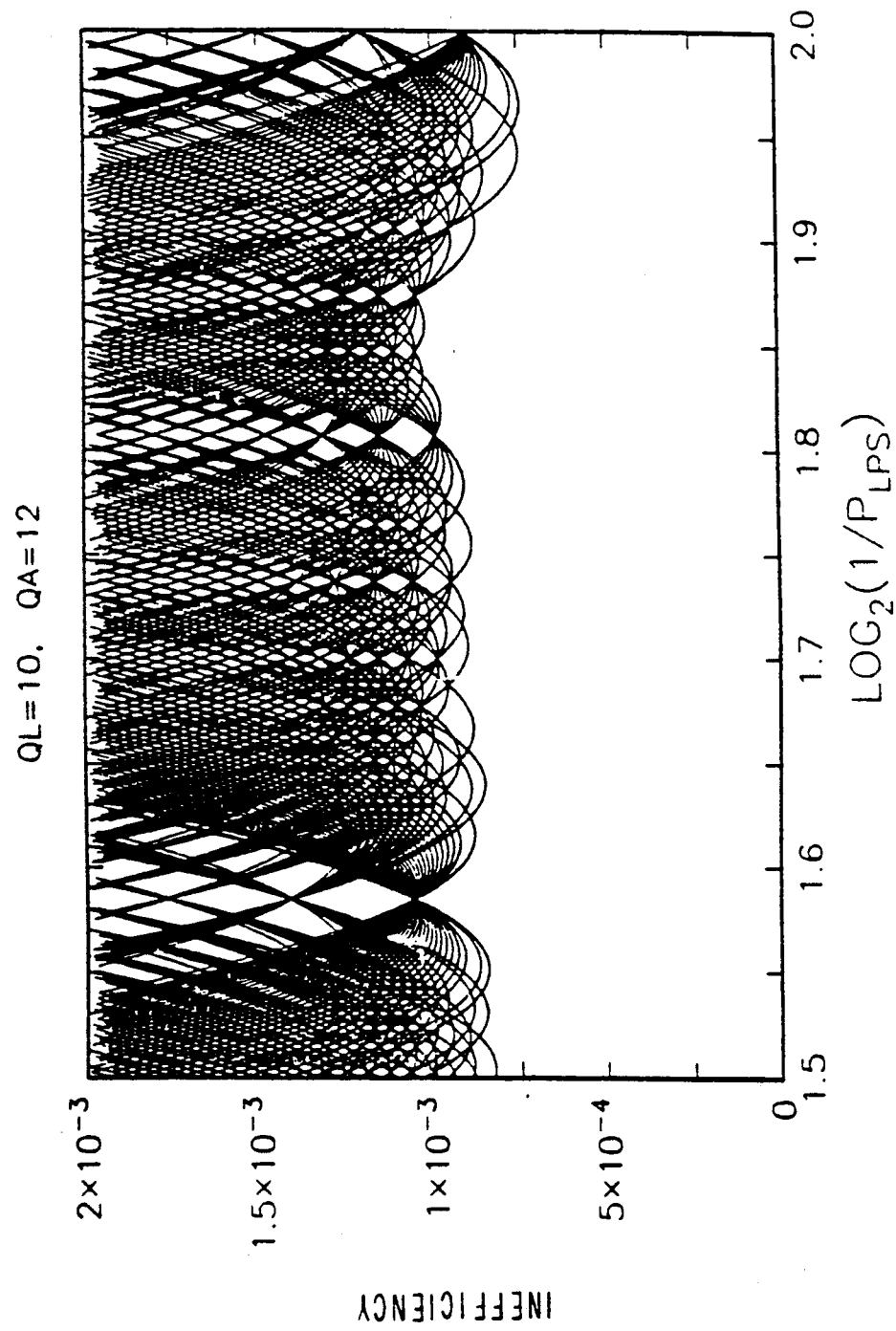
FIG. 14 is an illustration of a plurality of curves showing coding inefficiency relative to the entropy limit for all possible LP values for a sample probability interval.

Although different techniques may be applied in defining allowed probability values, a preferred methodology is noted with reference to FIG. 14. In FIG. 14, a plurality of curves are shown, each curve representing the coding inefficiency for a probability value.

It is initially noted that if probability is based on 10-bit precision, there are $2^{10}$ (or 1024) different possible probability value entires. FIG. 14 includes curves for all possible probability values for a sample probability interval.

For each possible entry, there is an Entropy defined as:

$$\text{Entropy} = -P\log2(P) - Q\log2(Q)$$

where (P+Q=1). Entropy is represented in terms of bits/symbol for ideal coding. A "Bit Rate" is also defined as:

$$\text{Bit Rate} = -P\log2(P_{est}) - Q\log2(Q_{est})$$

where $(P_{est}+Q_{est}) \leq 1$. The "Bit Rate" is represented as bits per symbol for the estimated probabilities.

For a given possible probability value, there is then defined a corresponding coding inefficiency characterized as:

$$\text{INEFFICIENCY} = \frac{\text{Bit Rate} - \text{Entropy}}{\text{Entropy}}$$

QL and QA represent the log and antilog precisions, respectively. The relative error for various probabilities is defined as the coding inefficiency as set forth hereinabove.

FIG. 14 depicts coding inefficiency along the ordinate and a probability-related value along the abscissa.

A first step in reducing the number of allowed probabilities is to retain a probability only if it has an inefficiency curve with a value at a given point along the abscissa that is less than the value of all other curves at that given point. That is, each probability that does not define a minimum relative to all other curves, at a given abscissa value, is not an allowed value.

A second step in reducing the number of allowed probabilities includes setting a maximum inefficiency value along a defined range of abscissa values. The leftmost curve—remaining after the first step—is followed upward and to the right of its minimum until it intersects another curve at a point above the set maximum inefficiency.

The intersection immediately preceding the intersection that exceeds the set maximum is noted, and the curve corresponding thereto is selected as the second allowed probability. (The probability for the leftmost curve is the first allowed probability.) The second allowed probability is then similarly followed until it intersects a curve above the set maximum. The preceding intersection is noted as is the curve corresponding thereto, the probability of that curve being the third allowed probability. Successive probabilities are similarly determined. In FIG. 14, the threshold is set at 0.002.

The second step is exemplified in FIG. 15. The first curve is followed to first intersection point A that exceeds the maximum inefficiency of 0.002. The second curve is then tracked to intersection point B. The third curve is then followed and so on. The respective probabilities corresponding to the first, second and third curves are retained. The probability corresponding to curve D is discarded.

The last step involves retaining all curves which are retained in the first step and which are outside the range set forth in the second step. The range terminates preferably at the abscissa point beyond which no curves have inefficiencies below the maximum, e.g., 0.002.

The above-noted algorithm achieves tremendous reduction in the number of allowed probabilities while at the same time achieving substantial uniformity along the log probability scale. That is, for 10-bit precision, the original 1024 possible probabilities have been reduced to 48 allowed probabilities which are—over the above-mentioned range—substantially uniformly spaced along a log probability scale.

4. Alternative Embodiments

One embodiment of the present invention is illustrated in FIG. 16. The probability adapter 200 has a symbol input which enters MPS and LPS decision events as inputs. Each symbol input enters a first counter 202 which counts all events, such as black and white pixel events, the total count being labelled n. A second counter 204 maintains a count for each LPS event, the LPS count being K. The k count is tested against a prescribed upper confidence limit kmax in element 206 and against a lower confidence limit kmin in element 208. A method of computing kmin and kmax is set forth hereinabove. A third element 210 tests n against a prescribed limit nmax. Then K>kmax in element 206, an LPS probability increases 212 acts to augment the value of q to be within confidence. Also when k>kmax in element 206, counters 202 and 204 are reset to zero. Moreover, when k>kmin in element 208 and element 210 signals that n>nmax, q is reduced in value by LPS probability decreaser 214 bring q within confidence. Also when k<kmin and n>nmax, the two counters 202 and 204 are reset. If neither confidence limit is breached, a next symbol is entered without a change in the value of q. The estimation process is adaptive, the value of q being changed whenever a confidence limit is breached.

While the invention has been described with reference to preferred embodiments thereof, it will be understood by those skilled in the art that various changes in form and details may be made without departing from the scope of the invention.

For example, although a kavg of 8 has provided good results, experiments with other values ranging from 4 to 14 indicate that the choice of both kavg and the confidence limit is not critical. It is, however, important to not over-estimate the change in q, as this will lead to an excessive sensitivity to statistical fluctuations and "hunting."

Also, although each q is described as having its own $P_{k,n}$ table, these values may alternatively be computed on the fly as when a new q value is determined.

A more elegant embodiment for probability adaptation avoids dependence on the structure of the probability table. In this alternative approach, it is recognized that tables I and II contain the log2 of the ratio of the old and new q values—a total ratio. If each entry in the table of allowed probabilities also contains a parameter dlogq (the log of the ratio of the q for this entry and the q for the entry above), the table has the following columns: log p, log q/p, nmaxlp, lgnmaxlp, and dlogq. The required new position in the corresponding table of allowed probabilities can be readily reached as follows. Subtract the dlogq for the current entry from the total ratio which yields a new total ratio. The next adjacent dlogq value (in the appropriate up or down direction) is subtracted from the new total ratio and so on until the new total ratio is zero—at which point the correct table position has been reached. Accordingly, if for example, q is to be made smaller, the process requires a very simple lookup table to obtain the required log2(q/qnew) for any given k value. Then as the pointer to the probability table is shifted to the next smaller q, dlogq is subtracted from the log of the ratio. When the log of the ratio is zero, the correct table position has been reached.

With regard to making q larger it is recognized that log2 nmax/n is a good approximation to log qnew/q. A good approximate value of log2 nmax/n can be obtained as follows: the Log Coder counts symbols in units of log2 p, where the log is scaled by a factor of 1024 to allow integer arithmetic. If the symbol count n is in units of log2 p, the value of nmax (in units of log p) does not vary more than a factor of two over the entire allowed range of p (log p from 1 to 1024). Consequently, an approximate value of log n can readily be derived from a simple lookup table, and the value of log nmax can be stored directly in the probability table itself as lgnmaxlp. The difference then provides a good estimate of log2 qnew/q. This estimate of log2 qnew/q is decremented by dlogq as the probability table pointer is moved toward larger q.

Furthermore, the algorithm for reducing the number of table entries (e.g., from 1024 to 48) may include other steps without departing from the scope of the invention as claimed. Depending on application, for example, the selection of allowed probabilities may differ.

Crossing the q=0.5 bound requires special handling. Because the log nmax/n is an underestimation of log qnew/q after the redefinition of LPS and MPS, any remainder in log qnew/q is doubled to approximately correct for the underestimation when the crossing occurs.

Still further, the present invention contemplates as an equivalent alternative that the bounds be defined so that kmin and kmax are still within confidence. In such an embodiment, confidence is exceeded when k<min when nmax is exceeded, and when k>kmax. In this regard, the k<kmin condition may be examined when n=nmax or, alternatively, when n first exceeds nmax. Similarly, with regard to the $n_1$ and $n_2$ thresholds, the triggering condition may include or, alternatively, exclude the case where $n=b_1$ or where $n=n_2$, respectively. Such variations, it is readily observed, are governed by the teachings of the present invention.

The alternative embodiments provide results comparable with those achieved by the simple embodiment specified hereinabove.

Appendix I. PDS code implementation of the probability adaptation scheme. Note that forward polish notation is used so an operator is followed by its operands.

```
function adptprob yn(w);

(called for each symbol to be encoded)
   n=+n lp              (count the events in the confidence interval)
   if yn=mps            (symbol = most probable symbol)
      codemps           (sum the bits to code a mps)
      if n lge expl nmax  (if event count large enough)
         updatemps      (check n for mps update)
      endif
```

```
    else                    (symbol = least probable symbol)
      k=+k 1                (increment lps count)
      codelps               (sum the bits to code a lps)
      updatelps             (update q if needed)
    endif
endfn replace tdi; 10 endrepl register i bl p
  replace qsmaller;
    i=+i tdi                :(next slot in probtbl)
    if logp=0               :(if end of table)
      i=-i tdi              :(back up)
    else                    :(see if q should be even smaller)
      if k->kmin1           :(really confident interval wrong)
        i=+i expl halfi     :(half of present q in table)
        if k->kmin2         :(absolutely sure interval wrong)
          i=+i expl halfi   :(halve q again)
        endif
      endif
      lp=expl logp          :(update counting unit)
    endif
  endrepl replace switchmps;
  if i lle probaddr         :(MPS change - fell off end of table)
    i=probaddr              :(force back in range)
    mps=eor mps 1           :(interchange def of MPS)
    i=+i incrsv
  endif
endrepl replace dblindex;
  if i lgt probaddr
    i=-i expl dbli
  else
    incrsv=+incrsv expl dbli
```

```
      endif
   endrepl replace incrindex;
   if i lgt probaddr
      i=-i tdi
   else
      incrsv=+incrsv tdi
   endif
endrepl replace qbigger;
   incrsv=0
   if n llt expl srl nmaxlp 1    :(if n < 1/2 nmax)
      if n llt expl srl nmaxlp 2    :(if n < 1/4 nmax)
         dblindex
      endif
      dblindex
   else
      n=-expl nmaxlp n              :(amount left)
      if n lge expl srl nmaxlp 2    :(if (nmax-n) >= 1/4 nmax)
         incrindex
      endif
      incrindex                     :(next slot in probtbl)
   endif
   switchmps
   lp=expl logp                     :(update counting unit)
endrepl replace updatemps;
   if k ¬> kmin              :(if fluctuation encountered)
      qsmaller
   endif
   k=0                       :(zero lps count)
   n=0                       :(zero interval event count)
endrepl
```

```
replace updatelps;
   if k ¬< kmax              :(if fluctuation encountered)
      qbigger
      k=0
      n=0
   else
      if n lgt expl nmax     :(if at end of block)
         n=expl nmax          :(clamp n - in coder, clamp difference)
      endif
   endif
endrepl replace codelps;
   bits=+bits expl +lqp logp
endrepl replace codemps;
   bits=+bits expl logp
endrepl
```

The following function is used to regenerate the lookup tables. Most of the code would not be required once the adaptation parameters are frozen.

```
function inittbl;
   (initiallize parameters for the adaptation test)
   float tem;
   pointer isv;
   word isvv blv;
   half nmaxdbl;
   half logpisv(base isv);
   half nmaxisv(base isv+4);
   static
      half probtbl(250);
```

(initiallize probability tables)

(* log p    log q/p    nmaxlp    halfi    dbli *)
init probtbl

| log p | log q/p | nmaxlp | halfi | dbli |
|---|---|---|---|---|
| 1024 | 0 | 16384 | hex 50 | hex 00 |
| 895 | 272 | 16110 | hex 50 | hex 0a |
| 795 | 502 | 15105 | hex 46 | hex 14 |
| 706 | 726 | 14826 | hex 46 | hex 1e |
| 628 | 941 | 14444 | hex 46 | hex 28 |
| 559 | 1150 | 13975 | hex 3c | hex 32 |
| 493 | 1371 | 13804 | hex 3c | hex 3c |
| 437 | 1578 | 13547 | hex 3c | hex 46 |
| 379 | 1819 | 13265 | hex 3c | hex 50 |
| 331 | 2044 | 13240 | hex 3c | hex 46 |
| 287 | 2278 | 12915 | hex 3c | hex 46 |
| 247 | 2521 | 12844 | hex 3c | hex 3c |
| 212 | 2765 | 12720 | hex 3c | hex 3c |
| 186 | 2971 | 12648 | hex 3c | hex 3c |
| 158 | 3227 | 12482 | hex 3c | hex 3c |
| 143 | 3382 | 12441 | hex 3c | hex 3c |
| 127 | 3566 | 12319 | hex 3c | hex 3c |
| 110 | 3788 | 12320 | hex 3c | hex 3c |
| 98 | 3965 | 12250 | hex 3c | hex 3c |
| 84 | 4200 | 12180 | hex 50 | hex 3c |
| 72 | 4435 | 12168 | hex 5a | hex 3c |
| 65 | 4590 | 12155 | hex 64 | hex 3c |
| 59 | 4737 | 12154 | hex 64 | hex 3c |
| 53 | 4899 | 12084 | hex 64 | hex 3c |
| 48 | 5050 | 12096 | hex 64 | hex 3c |
| 45 | 5147 | 12105 | hex 64 | hex 46 |
| 42 | 5250 | 12096 | hex 64 | hex 50 |
| 40 | 5325 | 12080 | hex 5a | hex 50 |
| 37 | 5441 | 12062 | hex 5a | hex 5a |
| 35 | 5527 | 12075 | hex 50 | hex 5a |
| 33 | 5617 | 12078 | hex 50 | hex 64 |
| 30 | 5758 | 12060 | hex 46 | hex 64 |
| 28 | 5863 | 12068 | hex 46 | hex 64 |
| 26 | 5976 | 12090 | hex 3c | hex 64 |
| 23 | 6157 | 12075 | hex 3c | hex 64 |

| | | | | |
|---|---|---|---|---|
| 21 | 6295 | 12075 | hex 3c | hex 64 |
| 19 | 6447 | 12103 | hex 32 | hex 5a |
| 17 | 6616 | 12121 | hex 32 | hex 50 |
| 15 | 6806 | 12150 | hex 28 | hex 46 |
| 13 | 7024 | 12181 | hex 28 | hex 3c |
| 11 | 7278 | 12221 | hex 1e | hex 3c |
| 9 | 7585 | 12294 | hex 1e | hex 32 |
| 7 | 7972 | 12411 | hex 1e | hex 28 |
| 5 | 8495 | 12615 | hex 1e | hex 1e |
| 4 | 8884 | 13120 | hex 14 | hex 1e |
| 3 | 9309 | 13113 | hex 14 | hex 1e |
| 2 | 10065 | 14574 | hex 0a | hex 14 |
| 1 | 11689 | 21860 | hex 00 | hex 0a |
| 0 | 0 | 0 | 0 | 0; | kmin2=0
kmin1=1
kmin= 5
kavg= 8
kmax= 11
b1=addr probtbl
(generate nmax from logp and lqp values in table above)
begin
  if logp¬=0
    tem=*floatit expl kavg power 2 /floatit expl +lqp logp 1024.
    nmax=expl fixit floor +0.5 tem
    nmx=nmax
    km=kmax
    km=*logp km
    nmax=*logp nmax
    b1=+b1 tdi
    repeat
  endif
endbegin
b1=addr probtbl
(generate index for nmax halved (q doubled))
begin
  if logp¬=0
    isv=b1

```
            nmaxdbl=srl nmx 1    (nmax required is half current nmax)
            begin
               if isv llt addr probtbl
                  isv=+isv tdi
                  leave
               endif
               if nmaxisv < nmaxdbl
                   leave
               endif
               isv=-isv tdi
               repeat
            endbegin
            dbli=expl -bl expl isv (delta to table where q doubled)
            bl=+bl tdi
            repeat
         endif
      endbegin
      bl=addr probtbl
      (generate index for nmax doubled (q halved))
         begin
            if logp¬=0
               isv=bl
               nmaxdbl=sll nmx 1
               begin
                  if nmaxisv > nmaxdbl
                     leave
                  else
                     isv=+isv tdi
                     if logpisv=0
                        isv=-isv tdi
                        leave
                     else
                        repeat
                     endif
                  endif
               endbegin
               km=+kmax kminl
               km=*logp km
```

```
            nmax=*logp nmax
            halfi=expl -isv expl bl  (delta to point where q halved)
            bl=+bl tdi
            repeat
        endif
    endbegin
    bl=addr probtbl
    probaddr=bl
    bpst=addr cbuffer
    mps=1
    k=0
    n=0
    lp=expl logp
endfn
```

Storage definitions:

```
    based bl
        half logp;              (log p at index i)
        half lqp;               (log q/p, used to determine efficiency)
        half nmaxlp;            (nmax in units of log p)
        half nmax(at nmaxlp);
        half halfi;             (pointer to q halved)
        half dbli;              (pointer to q doubled)

common
        word mps;               (most probable symbol value - 0 or 1)
        word yn;                (symbol to be coded)
        word bits;              (count bits for adaption test)
        word n;                 (event count)
        word nlp(at n);         (event count in lp units)
        word lr(at nlp);        (magnitude log of the range, same as nlp)
        half k;                 (short term lps count)
        half kmax;              (upper limit of confidence interval)
        half kavg;              (average lps count for confidence interval)
        half kmin;              (lower limit of confidence interval)
        half kmin1;             (if k ¬>, shift table index til nmax 2x)
        half kmin2;             (if k ¬>, shift table index til nmax 4x)
```

```
    half nmxsv;            (used in switchmps)
    word x;                (finite precision window on code stream)
    word lp;               (log p)
    word lr;               (log of the range)
    word lrm;              (maximum lr before change index)
    pointer probaddr;      (address of probtbl)
    word incrsv;
```

Appendix II. Test Results.

The following experiments were made using a set of 11 test files created using a random number generator. Nine of the files had fixed statistics with q probabilities from 0.5 to 0.0001. Two files had six short (1024 symbol) blocks, with varying probabilities from block to block. One file (p6.19) changed the probability from 0.1 to 0.9 on alternate blocks; the other (p6.501) changed the probability from 0.5 to 0.01 on alternate blocks. Note that the log2 values in the confidence limit calculation results have been multiplied by 1024.

The fixed statistics results were split into two halves (65535 symbols in each half). In the first half the overhead for adapting from a starting probability of 0.5 is included. The second half therefore is the true fixed statistics coding rate. The 'ideal' coding rate is the optimum coding rate that can be achieved by the Log Coder; this is within 0.2% of the entropy limit. Note that statistical fluctuations can sometimes produce better than 'ideal' coding rates.

Test 1: kmin=5, kavg=8, kmax=11

See Tables I and II for confidence calculations.

Adaptation According to the Specified Embodiment kmin2=0, kmin1=1, kmin=5, kavg=8, kmax=11

| file | 1st half | | 2nd half | | |
|---|---|---|---|---|---|
| | coded | ideal | coded | ideal | %inefficiency |
| p6.19 | 3168 | 2882 | | | 9.92 |

|   | 33 |   |   | 34 |   |
|---|---|---|---|---|---|
| p6.501 | 3590 | 3320 |  |  | 8.13 |
| p0.5 | 65820 | 65536 | 65832 | 65536 | 0.45 |
| p0.25 | 53591 | 53367 | 53366 | 53096 | 0.51 |
| p0.1 | 30970 | 30826 | 30795 | 30697 | 0.32 |
| p0.05 | 18792 | 18740 | 18676 | 18623 | 0.28 |
| p0.01 | 5303 | 5260 | 5180 | 5167 | 0.25 |
| p0.005 | 3166 | 3109 | 2949 | 2939 | 0.34 |
| p0.001 | 928 | 875 | 763 | 757 | 0.79 |
| p0.0005 | 510 | 464 | 448 | 452 | _0.8 |
| p0.0001 | 239 | 190 | 87 | 87 | 0.00 |

Test 2: $k_{min}=10$, $k_{avg}=14$, $k_{max}=18$

Confidence limit calculations:

For q=0.0625 confidence level=0.167177 for kmin=10., nmax=224.

| k | qnew | log2(q/qnew) |
|---|---|---|
| 10. | 0.0625 | 0 |
| 9. | 0.0573 | 127 |
| 8. | 0.0522 | 265 |
| 7. | 0.0472 | 415 |
| 6. | 0.0420 | 588 |
| 5. | 0.0367 | 787 |
| 4. | 0.0313 | 1020 |
| 3. | 0.0259 | 1303 |
| 2. | 0.0202 | 1665 |
| 1. | 0.0144 | 2172 |
| 0. | 0.0079 | 3046 | confidence level=0.165822 for kmax=18., nmax=224.

| n | log2(nmax/n) | qnew | log2(qnew/q) |
|---|---|---|---|
| 18. | 3724 | 0.9050 | 5523 |
| 56. | 2047 | 0.2558 | 2081 |
| 112. | 1024 | 0.1258 | 1033 |
| 168. | 424 | 0.0835 | 427 |
| 224. | 0 | 0.0624 | 2 |

Adaptation According to the Specified Embodiment kmin2=1, kmin1=4, kmin=10, kavg=14, kmax=18

| file | 1st half | | 2nd half | | |
|---|---|---|---|---|---|
| | coded | ideal | coded | ideal | %error |
| p6.19 | 3304 | 2882 | | | 14.64 |
| p6.501 | 3722 | 3320 | | | 12.11 |
| p0.5 | 65785 | 65536 | 65770 | 65536 | 0.36 |
| p0.25 | 53546 | 53367 | 53235 | 53096 | 0.26 |
| p0.1 | 30914 | 30826 | 30765 | 30697 | 0.22 |
| p0.05 | 18789 | 18740 | 18653 | 18623 | 0.16 |
| p0.01 | 5319 | 5260 | 5184 | 5167 | 0.33 |
| p0.005 | 3168 | 3109 | 2955 | 2939 | 0.54 |
| p0.001 | 970 | 875 | 758 | 757 | 0.13 |
| p0.0005 | 563 | 464 | 445 | 452 | 1.5 |
| p0.0001 | 276 | 190 | 87 | 87 | 0.00 |

Test 3: kmin=2, kavg=4, kmax=6

Confidence calculations:

For q=0.0625 confidence level=0.228699 for kmin=2., nmax=64.

| k | qnew | log2(q/qnew) |
|---|---|---|
| 2. | 0.0625 | 0 |
| 1. | 0.0432 | 544 |
| 0. | 0.0228 | 1488 | confidence level=0.20969 for kmax=6., nmax=64.

| n | log2(nmax/n) | qnew | log2(qnew/q) |
|---|---|---|---|
| 6. | 3496 | 0.7702 | 4219 |
| 16. | 2047 | 0.2572 | 2089 |
| 32. | 1024 | 0.1260 | 1035 |
| 48. | 424 | 0.0835 | 427 |
| 64. | 0 | 0.0624 | _3 |

Adaptation According to the Specified Embodiment (kmin2 not used), kmin1=0, kmin=2, kavg=4, kmax=6

| file | 1st half | | 2nd half | | %error |
|---|---|---|---|---|---|
| | coded | ideal | coded | ideal | |
| p6.19 | 3052 | 2882 | | | 5.90 |
| p6.501 | 3521 | 3320 | | | 6.05 |
| p0.5 | 66038 | 65536 | 66080 | 65536 | 0.83 |
| p0.25 | 54051 | 53367 | 53752 | 53096 | 1.24 |
| p0.1 | 31115 | 30826 | 31013 | 30697 | 1.03 |
| p0.05 | 18938 | 18740 | 18817 | 18623 | 1.04 |
| p0.01 | 5322 | 5260 | 5190 | 5167 | 0.45 |
| p0.005 | 3157 | 3109 | 2974 | 2939 | 1.19 |
| p0.001 | 931 | 875 | 766 | 757 | 1.19 |
| p0.0005 | 500 | 464 | 452 | 452 | 0.00 |
| p0.0001 | 231 | 190 | 87 | 87 | 0.00 |

We claim:

1. A computer-implemented method of selecting an optimal estimated probability of the occurrence of a binary symbol in accordance with its estimated probability of occurrence in actual data, comprising the steps of:

storing in computer memory only m optimal estimated probabilities in an n-bit precision table, where m is an integer less than $2^n$ and $2^n$ is the number of possible estimated probabilities for the occurrence of said binary symbol in said actual data, said storing comprising:

setting a first pointer at the first entry position in said table;

creating a set of inefficiency curves of said $2^n$ possible estimated probability values on an axis of possible estimated probabilities;

setting a second pointer at the first possible estimated probability value on said axis and using said second pointer to sample all of said inefficiency curves at said first possible estimated probability value and then successively sampling at all of said $2^n$ possible estimated probability values on said axis;

during said sampling selecting the values of said m optimal estimated probabilities from said inefficiency curves such that said m probability values are only those possible estimated probabilities with at least one point in their inefficiency curves having an inefficiency value that is less than the inefficiency values of the points of all the other curves of possible estimated probability values at at least one point along said axis; and storing the first m probability value selected at the first entry position in said table, and then moving said first pointer to a successive position in said table each time an m probability value is selected and storing said selected value at said respective successive position in said table; and upon the input to said table of a possible estimated probability value based on the occurrence of said binary symbol, generating the one of said m probability values that is optimal for said possible estimated probability value.

2. A method as in claim 1 wherein said binary symbol is included in an actual data stream of binary symbols representing physical entities, during the coding thereof, and further comprising the steps of:

selecting a first position in said table, and identifying a prescribed set of next positions from said first position;

setting a pointer at said first position;

monitoring the actual data stream of binary symbols containing said binary symbol during coding; and moving said pointer from said first table position to one of said next positions, in response to the occurrence of said given binary symbol in said actual data stream being monitored, to effectuate a change in the optimal estimated probability when indicated by the estimated probability value of said occurrence, during the coding of said data stream.

3. A method as in claim 1 further comprising the step of eliminating those m values from said table that have a coding inefficiency for a possible estimated probability value that is beyond a selected inefficiency limit.

4. A computer-implemented method as in claim 1 comprising further limiting the number of selected m optimal estimated probabilities values using the inefficiency curves remaining after the initial selecting of said m probability values, according to the further steps of:

setting a maximum inefficiency value along a given range of said axis;

selecting the estimated probability of the leftmost inefficiency curve remaining after the initial selecting of said m probability values, as the first m value;

following said leftmost inefficiency curve upward and to the right of its minimum point until it intersects another inefficiency curve at a point above the set maximum inefficiency value;

selecting the estimated probability of the inefficiency curve that is intersected immediately preceding said curve first intersected at a point above the set maximum inefficiency value, as the second m value;

following said immediately preceding inefficiency curve upward and to the right of its intersection point with said leftmost inefficiency curve until it next intersects another inefficiency curve at a point above the set maximum inefficiency value;

selecting the estimated probability of the inefficiency curve that is intersected immediately preceding said curve next intersected at a point above the set maximum inefficiency value, as the third m value; and selecting additional m values by following successive immediately preceding intersected curves in the manner set forth with regard to said leftmost inefficiency curve and said curve intersected immediately preceding said curve first intersected at a point above the set maximum inefficiency value, until all of the m values along said given range of said axis have been selected.

5. A computer-implemented method of adapting the value of an estimated probability of the occurrence of a given binary symbol, to reflect its estimated probability of occurrence in actual data, during the coding of an actual data stream of binary symbols representing physical entities, comprising the steps of:

storing in computer memory only m probabilities in an n-bit precision table, where m is an integer less than $2^n$ and $2^n$ is the number of possible estimated probabilities;

limiting the m probabilities in said table to include only allowed estimated probabilities, wherein an allowed estimated probability has a coding inefficiency for at least one possible estimated probability value that is a minimum relative to the coding inefficiencies for all other possible estimated probabilities at said one possible estimated probability value;

selecting a first position in said table, and identifying a prescribed set of next positions from said first position;

setting a pointer at said first position;

monitoring said actual data stream of binary symbols being coded; and moving said pointer from said first table position to one of said next positions, in response to the occurrence of said given binary symbol in said data stream being monitored, to adapt the value of the estimated probability of said symbol, when indicated, to reflect the estimated probability of said occurrence, during the coding of said data stream.

6. A method as in claim 5 further comprising the step wherein each allowed estimated probability is limited to those having a coding inefficiency for an actual probability value that is within some selected inefficiency limit.

7. A computer-implemented method as in claim 5 comprising further limiting the number of allowed estimated probabilities using the inefficiency curves remaining after the initial limiting of said m probability values, according to the further steps of:

setting a maximum inefficiency value along a given range of said possible estimated probability values;

selecting the estimated probability of the leftmost inefficiency curve remaining after the initial selecting of said m probability values, as the final m value;

following said leftmost inefficiency curve upward and to the right of its minimum point until it intersects another inefficiency curve at a point above the set maximum inefficiency value;

selecting the estimated probability of the inefficiency curve that is intersected immediately preceding said curve first intersected at a point above the set maximum inefficiency value, as the second m value;

following said immediately preceding inefficiency curve upward and to the right of its intersection point with said leftmost inefficiency curve until it next intersects another inefficiency curve at a point above the set maximum inefficiency value;

selecting the estimated probability of the inefficiency curve that is intersected immediately preceding said curve next intersected at a point above the set maximum inefficiency value, as the third m value; and selecting additional m values by following successive immediately preceding intersected curves in the manner set forth with regard to said leftmost inefficiency curve and said curve intersected immediately preceding said curve first intersected at a point above the set maximum inefficiency value, until all of the m values along said given range of said possible estimated probability values have been selected.

8. Computer apparatus which adjusts a current probability for the occurrence of a binary symbol based on its occurrence in an actual data stream of binary symbols representing physical entities, which stream is being coded, comprising:

a deterministic finite state machine having (a) a plurality of machine states, each machine state corresponding to a probability in an n-bit precision table, and (b) transitions, each transition extending from one machine state to another machine state; and wherein said table comprises m probabilities, m being an integer less than $2^n$ and $2^n$ being the number of possible probabilities for the occurrence of said binary symbol in said actual data stream;

means for establishing a first machine state which corresponds to the current probability;

means for connecting said first machine state to each of a prescribed set of states by a corresponding transition wherein each state of the set corresponds to a probability differing from the probability of said first state; and means for selecting the appropriate transition to a second machine state from the set of states when actual data indicates a corresponding deviation from the current probability during the coding of said data stream.

9. The apparatus of claim 8 wherein said selecting means includes:

means for choosing a second machine state which is one position away from the position of the current probability after a confidence limit for the current probability is exceeded by no more than a corresponding predefined level.

10. The apparatus of claim 9 wherein said selecting means further includes:

means for choosing a second machine state corresponding to a position at which the current probability is doubled after a value corresponding to a first confidence limit for the current probability is exceeded by more than a corresponding predefined level; and means for choosing a second machine state corresponding to a position at which the current probability is halved after a value corresponding to a second confidence limit for the current probability is exceeded by more than a corresponding predefined level.

11. The apparatus of claim 10 wherein said selecting means further includes:

means for choosing a second machine state corresponding to a position at which the current probability is quadrupled after a value corresponding to a first confidence limit for the current probability is exceeded by more than a corresponding predefined level; and means for choosing a second machine state corresponding to a position at which the current probability is quartered after a value corresponding to a second confidence limit for the current probability is exceeded by more than a corresponding predefined level.

12. A computer-implemented method of adapting the probability of the occurrence of a first of two binary symbols to its occurrence in actual physical event occurrence data involving a series of events, each represented by one or the other of the two symbols, comprising the steps of:

storing occurrence probabilities for a first of the two symbols at respective positions in a table in computer memory;

for each position in the table, associating in memory a prescribed set of next positions corresponding thereto;

storing precomputed confidence limits in memory;

setting a pointer to a current position in the table; and when the current position corresponds to a probability which, when applied to said actual data, results in loss of confidence based on said precomputed confidence limits, moving the pointer to a next position in the set corresponding to the probability in the set which is just sufficient to restore confidence when confidence is lost.

13. A computer-implemented method of adapting an estimated probability of the occurrence of a given binary symbol to reflect its estimated probability of occurrence in an actual data stream of binary symbols representing physical entities, during the coding of said data stream, comprising the steps of:

storing in computer memory only m probability in an n-bit precision table, where m is an integer less than $2^n$ and $2^n$ is the number of possible actual estimated probabilities;

limiting the m probabilities in said table to include only allowed estimated probabilities, wherein each allowed estimated probability has a coding inefficiency for an actual estimated probability value that is within some selected inefficiency limit;

selecting a first position in the table, and identifying a prescribed set of next positions from said first position;

setting a pointer at said first position;

monitoring an actual data stream of binary symbols being coded; and moving said pointer from said first table position to one of said next positions, in response to the occurrence of said given binary symbol in said actual data stream being monitored, to effectuate a change in the estimated probability when indicated by the actual estimated probability value of said occurrence, during the coding of said data stream.

14. Computer apparatus for selecting an optimal estimated probability of the occurrence of a binary symbol which reflects its estimated probability of occurrence in actual data, comprising:

means for storing in computer memory only m probabilities in an n-bit precision table, where m is an integer less than $2^n$ and $2^n$ is the number of possible actual estimated probability values, said storing means comprising:

means for setting a first pointer at the first entry position in said table;

means for creating a set of inefficiency curves of all said possible estimated probability values on a log probability scale;

means for setting a second pointer at the first possible estimated probability value on said scale and using said second pointer to sample all of said inefficiency curves at said first possible estimated probability value and then successively sampling at all of said possible estimated probability values on said scale;

means for determining during said sampling said m probabilities from said inefficiency curves of all said possible estimated probability values on said log probability scale, wherein said m probabilities are those with a point in their inefficiency curve, at a position along the scale abscissa, having a value that is less than the values of the points of all the other curves at said position along the scale abscissa; and means for storing the first m probability value selected at the first entry position in said table, and then moving said first pointer to a successive position in said table each time an m probability value is selected and storing said selected value at said respective successive position in said table; and means, responsive to the input to said table of an estimated probability value based on an actual occurrence of said binary symbols, for generating the one of said m probability values corresponding thereto as said optimal estimated probability.

15. Apparatus as in claim 14 wherein said binary symbol is included in an actual data stream of binary symbols representing physical entities, during the coding thereof, and further comprising:

means for selecting a first position in said table, and identifying a prescribed set of next positions from said first position;

means for setting a pointer at said first position;

means for monitoring the actual data stream of binary symbols containing said binary symbol during coding; and means for moving said pointer from said first table position to one of said next positions, in response to the occurrence of said given binary symbol in said actual data stream being monitored, to effectuate a change in the optimal estimated probability when indicated by the estimated probability value of said occurrence, during the coding of said data stream.

16. Apparatus as in claim 14 further comprising means for limiting the optimal estimated probabilities to those having a coding inefficiency for an actual probability value that is within some selected inefficiency limit.

17. Computer apparatus for adapting an estimated probability of the occurrence of a given binary symbol used in coding to its estimated probability of occurrence in actual data, during the coding of an actual data stream of binary symbols representing physical entities, comprising:

means for storing in computer memory only m probabilities in an n-bit precision table, where m is an integer less than $2^n$ and $2^n$ is the number of possible actual data estimated probabilities;

means for limiting the m probabilities in said table to include only allowed estimated probability values on an axis of possible estimated probabilities, wherein said allowed estimated probability values are only those possible actual data estimated probabilities with at least one point in their inefficiency curves having a inefficiency value that is less than the inefficiency values of the points of all the other curves of possible estimated probability values at at least one point along said axis; and means for selecting a first position in said table, and identifying a prescribed set of next positions from said first position;

means for setting a pointer at said first position;

means for monitoring an actual data stream of binary symbols being coded; and means for moving said pointer from said first table position to one of said next positions, in response to the occurrence of said given binary symbol in said actual data stream being monitored, to effectuate a change in the estimated probability used in coding when indicated by the actual estimated probability value of said occurrence, during the coding of said data stream.

18. Computer apparatus for adapting the probability of the occurrence of a first of two binary symbols to its occurrence in actual physical event occurrence data involving a series of binary events, each event being represented by one or the other of the two symbols, comprising:

means for storing occurrence probabilities for a first of the two symbols at respective positions in a table in computer memory;

means for associating in memory a prescribed set of next positions corresponding to each position in the table;

means for storing precomputed confidence limits in memory;

means for setting a pointer to a current position in the table; and means for moving the pointer to a next position in the set corresponding to the probability in the set which is just sufficient to restore confidence, when the current position corresponds to a probability which, when applied to said actual data, results in loss of confidence based on said precomputed confidence limits.

19. Computer apparatus for selecting an optimal estimated probability of the occurrence of a binary symbol in accordance with its estimated probability of occurrence in actual data, comprising the steps of:

means for storing in computer memory only m optimal estimated probabilities in an n-bit precision table, where m is an integer less than $2^n$ and $2^n$ is the number of possible estimated probabilities for the occurrence of said binary symbol is said actual data, said storing means comprising:

means for setting a first pointer at the first entry position in said table;

means for creating a set of inefficiency curves of said $2^n$ possible estimated probability values on an axis of possible estimated probabilities;

means for setting a second pointer at the first possible estimated probability value on said axis and using said second pointer to sample all of said inefficiency curves at said first possible estimated probability value and then successively sampling at all of said $2^n$ possible estimated probability values on said axis;

means for selecting, during said sampling, the values of said m optimal estimated probabilities from said inefficiency curves such that said m probabilities value are only those possible estimated probabilities with at least one point in their inefficiency curves having an inefficiency value that is less than the inefficiency values of the points of all the other curves of possible estimated probability values at at least one point along said axis; and means for storing the first m probability value selected at the first entry position in said table, and then moving said first pointer to a successive position in said table each time an m probability value is selected and storing said selected value at said respective successive position in said table; and means for generating, upon the input to said table of a possible estimated probability value based on the occurrence of said binary symbol, the one of said m probability values that is optimal for said possible estimated probability value.

* * * * *